（12） United States Patent
Akiyama et al.

(10) Patent No.: US 8,507,943 B2
(45) Date of Patent: Aug. 13, 2013

(54) SEMICONDUCTOR LIGHT-EMITTING ELEMENT

(75) Inventors: Keita Akiyama, Tokyo (JP); Takuya Kazama, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/430,637

(22) Filed: Mar. 26, 2012

(65) Prior Publication Data

US 2012/0241808 A1    Sep. 27, 2012

(30) Foreign Application Priority Data

Mar. 24, 2011    (JP) .................................. 2011-066006

(51) Int. Cl.
*H01L 33/48* (2010.01)

(52) U.S. Cl.
USPC ......................................................... 257/99

(58) Field of Classification Search
USPC ................. 257/E29.069–E29.071, E29.245, 257/E49.001–E49.004, E21.404, 257/E33.056–E33.059, E25.032, 186, E31.005, 257/116, 117, 432–437, 749, E29.297–E29.298, 257/E21.603, E21.605, E21.086, 257/E21.097–E21.1, E21.118, E21.542, 257/E21.543, E21.697–E21.699, 13, 79–103, 257/918, E51.018–E51.022, E33.001–E33.077, 257/E33.054, E25.028, E31.058, E31.063, 257/E31.115, E27.133–E27.139, 252–254, 257/257–258, 9, 14, 85, 90, 94; 438/223–228, 438/22–47, 69, 493, 503, 507, 956, 962, 438/48, 77, 84, 93–95, 102, 104, 188, 189, 438/438/285, 603–604, 930–933, 51, 55, 438/64–68, 83, 98
See application file for complete search history.

(56) References Cited

U.S. PATENT DOCUMENTS

| | | | | |
|---|---|---|---|---|
| 7,541,206 | B2 * | 6/2009 | Yoon et al. ...................... | 438/29 |
| 7,704,770 | B2 | 4/2010 | Sung et al. | |
| 8,013,356 | B2 * | 9/2011 | Tanaka et al. ................... | 257/99 |
| 8,183,582 | B2 * | 5/2012 | Daniels .......................... | 257/88 |
| 8,207,550 | B2 * | 6/2012 | Chen et al. ..................... | 257/98 |
| 2006/0054907 | A1 * | 3/2006 | Lai ................................. | 257/96 |
| 2006/0094244 | A1 * | 5/2006 | Yamada et al. ............... | 438/700 |
| 2008/0273562 | A1 * | 11/2008 | Hasegawa et al. ......... | 372/44.01 |

FOREIGN PATENT DOCUMENTS

| | | |
|---|---|---|
| JP | 2007-227895 A | 9/2007 |
| JP | 2010-192709 A | 9/2010 |

* cited by examiner

*Primary Examiner* — Dao H Nguyen
*Assistant Examiner* — Tram H Nguyen
(74) *Attorney, Agent, or Firm* — Kenealy Vaidya LLP

(57) ABSTRACT

A semiconductor light-emitting element with a counter electrode structure can include a first electrode including at least one linear first electrode piece that is disposed on a surface of a first semiconductor layer close to the support substrate and in ohmic contact with the first semiconductor layer, a second electrode including at least one linear second electrode piece that is disposed on a surface of a second semiconductor layer and in ohmic contact with the second semiconductor layer. A plurality of conical projections can be formed on the second semiconductor layer. The first electrode piece and the second electrode piece can be disposed so as not to overlap with each other in a stacked direction of the semiconductor light-emitting stacked body but to be parallel with each other when viewed from above.

7 Claims, 14 Drawing Sheets

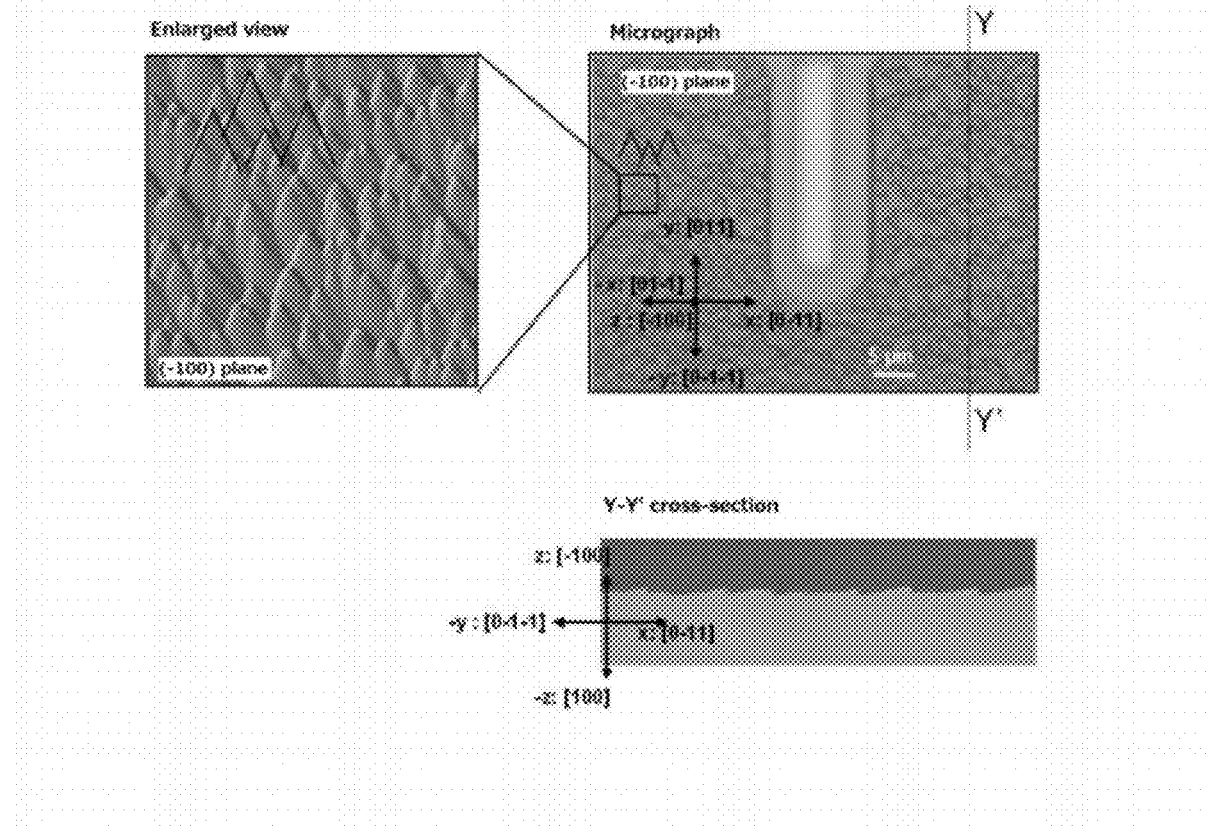

Fig. 11

| Width of Electrode Protection Area (μm) | 2 | 2.25 | 3.25 |
|---|---|---|---|
| Comparative Example 1 | 0.99 | 0.95 | 0.90 |
|  | 0.78 | 0.85 | 0.95 |
| Comparative Example 2 | 1.0 | 0.98 | 0.96 |
|  | 0.82 | 0.91 | 1.0 |
| Example | 1.0 | 0.99 | 0.96 |
|  | 1.0 | 1.0 | 1.0 |

Note: Numeral with bold font is the basis for normalization
Upper stand: Luminance
Lower stand: Electrostatic withstanding voltage

SEMICONDUCTOR LIGHT-EMITTING ELEMENT This application claims the priority benefit under 35 U.S.C. §119 of Japanese Patent Application No. 2011-066006 filed on Mar. 24, 2011, which is hereby incorporated in its entirety by reference.

TECHNICAL FIELD

The presently disclosed subject matter relates to a semiconductor light-emitting element such as a light-emitting diode (LED), and in particular, to an electrode structure and a light extraction structure of such a semiconductor light-emitting element.

BACKGROUND ART

A light output or a light extraction output of a semiconductor light-emitting element may be limited by a surrounding medium such as air or an epoxy resin and a semiconductor material due to the difference between the refraction indices of these materials. For example, if an AlGaInP type semiconductor material for a light-emitting element (refraction index SEMI=3.3) and a resin (refraction index RESIN=1.5) are used, the critical angle is 27 degrees and the reflectance of the boundary therebetween is about 15%, meaning that the extractable light to the outside may be limited to about 4.5%.

Incidentally, a semiconductor layer in a semiconductor light-emitting element can be produced on a growth substrate such as a GaAs substrate for an AlGaInP layer and a sapphire substrate for a GaN layer. In order to achieve a high efficiency, deterioration of light output due to the absorption or confinement of light emitted from the active layer to a growth substrate should be prevented.

In particular, a semiconductor light-emitting element formed from an AlGaInP type material can be produced by an MOCVD method on a GaAs substrate that can be lattice-matched to the AlGaInP type material. However, in a semiconductor light-emitting element formed from the AlGaInP type material, the bandgap of the active layer is larger than the bandgap of the GaAs substrate. Thus, part of light emitted and directed to the light extraction surface can be extracted, but light directed to the GaAs substrate may be absorbed by the GaAs substrate, thereby deteriorating the efficiency.

Conventionally, an MOCVD method can be used to produce a semiconductor element on a GaAs growth substrate. In another known art, such a GaAs growth substrate is removed and then a different substrate is provided via a metal to form a semiconductor light-emitting element (referred to as an MB structure). For example, Japanese Patent Application Laid-Open No. 2007-227895 discloses a semiconductor light-emitting element having such a structure. Such a semiconductor light-emitting element is provided with a reflection minor to the opposite side to the light extraction surface of the element. The light that has been absorbed by the growth substrate in a conventional case can be reflected to be redirected to the outside, thereby improving the light extraction output. Such a semiconductor light-emitting device can have a semiconductor layer of which surface on the light extraction surface side can be roughened to a random shape, arrangement, size, and the like. The roughening intends to change the propagation direction of light within the semiconductor and extract the light component at angles over the critical angle, thereby improving the light output. In particular, the semiconductor light-emitting element with an MB structure may cause the light to be multiply reflected within the semiconductor, and accordingly, the roughening can largely improve the light output.

Further known is a semiconductor light-emitting element in which the electrode on the light extraction surface side is shifted so as not to overlap with the electrode on the opposite side thereto when viewed from above (so called a counter electrode structure). Such a semiconductor light-emitting element with the counter electrode structure can achieve uniform current diffusion with less electrode coverage, thereby improving light output (see Japanese Patent Application Laid-Open No. 2010-192709).

In the semiconductor light-emitting element with such an MB structure as shown in Japanese Patent Application Laid-Open No. 2007-227895, the light extraction surface is randomly roughened, thereby improving the light output of the semiconductor light-emitting element. However, when roughening of the light extraction surface is simply performed, a plurality of projections are formed on the roughened surface. The tips of the plurality of projections are directed in random directions, and therefore, projections can be formed so that the tips thereof are directed in the same direction as a direction in which current flows through the element (current path). In general, if a semiconductor light-emitting element includes an MB structure having a reflection minor, the semiconductor light-emitting stacked body is composed only of layers produced by an MOCVD method. Since the thickness of the layer is very thin (10 μm or thinner) when compared with the distance between the electrode on the light extraction surface side and the electrode on the reflection surface side, the current path in an in-plane direction is longer than that in a perpendicular direction (in the thickness direction of the layers). Accordingly, if projections are formed so that the tips thereof are parallel to the current path in the in-plane direction, the electric field may concentrate on the tips of the projections, thereby lowering the electrostatic withstanding voltage.

In addition, the shorter the distance between the surface electrode piece and the projections on the roughened surface directed in the same direction as the current path is, the larger the current density near the projections becomes. Thus, the electric field may concentrate more and the electrostatic withstanding voltage may be lowered to a greater extent. The larger area of the semiconductor layer on the light extraction surface side to be roughened (ratio of the roughened surface) can improve the light output, but this configuration may shorten the distance between the projections and the surface electrode piece. Accordingly, it is difficult to simultaneously satisfy the light output and the improvement in the electrostatic withstanding voltage in view of the ratio of the roughened surface, which is a remaining problem of the conventional semiconductor light-emitting element with an MB structure that is to be solved.

SUMMARY

The presently disclosed subject matter was devised in view of these and other problems and features and in association with the conventional art. According to an aspect of the presently disclosed subject matter, a semiconductor light-emitting element can prevent the local concentration of electric field on the light extraction surface and simultaneously improve the light output and the electrostatic withstanding voltage.

According to another aspect of the presently disclosed subject matter, the semiconductor light-emitting element can include a support substrate and a semiconductor light-emitting stacked body including a first semiconductor layer formed on the support substrate, an active layer formed on the first semiconductor layer, and a second semiconductor layer formed on the active layer. The semiconductor light-emitting element can further include: a first electrode including at least one linear first electrode piece that is disposed on a surface of the first semiconductor layer close to the support substrate and in ohmic contact with the first semiconductor layer; a second electrode including at least one linear second electrode piece that is disposed on a surface of the second semiconductor layer and in ohmic contact with the second semiconductor layer; and a plurality of conical projections formed on the second semiconductor layer. Herein, the first electrode piece and the second electrode piece can be disposed so as not to overlap with each other in a stacked direction of the semiconductor light-emitting stacked body but to be parallel with each other when viewed from above. The plurality of conical projections disposed between the first and second electrode pieces disposed in parallel with each other can have axes that form an angle of ±26 degrees with respect to the extension direction of the first and second electrode pieces.

According to another aspect of the presently disclosed subject matter, a method for producing a semiconductor light-emitting element can include: forming a semiconductor light-emitting stacked body including a first semiconductor layer formed on a growth substrate, an active layer formed on the first semiconductor layer, and a second semiconductor layer formed on the active layer; forming a second electrode including at least one linear second electrode piece on a surface of the second semiconductor layer so as to be in ohmic contact with the second semiconductor layer; joining the semiconductor light-emitting stacked body having the second electrode formed therein with a support substrate; removing the growth substrate from the semiconductor light-emitting stacked body; forming a first electrode including at least one linear first electrode piece on a surface of the first semiconductor layer so as to be in ohmic contact with the first semiconductor layer; and forming a plurality of conical projections on an area of the first semiconductor layer where the first electrode is not formed. Herein, in the step of forming a first electrode, the first electrode piece and the second electrode piece can be disposed not to overlap with each other in a stacked direction of the semiconductor light-emitting stacked body but to be parallel with each other when viewed from above. In the step of forming a plurality of conical projections, the plurality of conical projections disposed between the first and second electrode pieces disposed in parallel with each other can have axes that form an angle of ±26 degrees with respect to the extension direction of the first and second electrode pieces.

In a semiconductor light-emitting element made in accordance with principles of the presently disclosed subject matter the semiconductor light-emitting stacked body with the MB structure can control the current path within the plane of the semiconductor layer by using counter electrodes including the upper and lower electrode arranged in a specific pattern. In addition, the anisotropic roughening can be achieved such that the projections are oriented in one axial direction (in a direction substantially perpendicular to the main direction of the current path) with respect to the main direction of the current path (not simple random roughening of projections). Thus, the concentration of electric field at the tips of the projections can be suppressed, thereby improving the electrostatic withstanding voltage of the element.

With the configuration of the presently disclosed subject matter, even when the rate of the roughened surface is made large, the light output can be improved without lowering the electrostatic withstanding voltage. Further, the projections and the current path can be aligned with each other, and accordingly, the shortening of the distance between the electrode and the projection forming area may not lower the electrostatic withstanding voltage.

BRIEF DESCRIPTION OF DRAWINGS

These and other characteristics, features, and advantages of the presently disclosed subject matter will become clear from the following description with reference to the accompanying drawings, wherein:

FIG. 10 is a micrograph of a roughened surface of the light extraction structure in which projections are oriented in one direction (Y direction) in the Example semiconductor light-emitting element made in accordance with principles of the presently disclosed subject matter, and its enlarged view and a photograph of the cross-section of the element;

FIG. 11 is Table 1 showing the results of the measured electrostatic withstanding voltage and the brightness of the Example semiconductor light-emitting elements and Comparative Examples 1 and 2;

DESCRIPTION OF EXEMPLARY EMBODIMENTS

A description will now be made below to exemplary vehicle lights of the presently disclosed subject matter with reference to the accompanying drawings in accordance with exemplary embodiments. It should be noted that the same or equivalent components and parts may be denoted by the same reference signs.

[Configuration of Semiconductor Light-Emitting Element]

Figure 1:
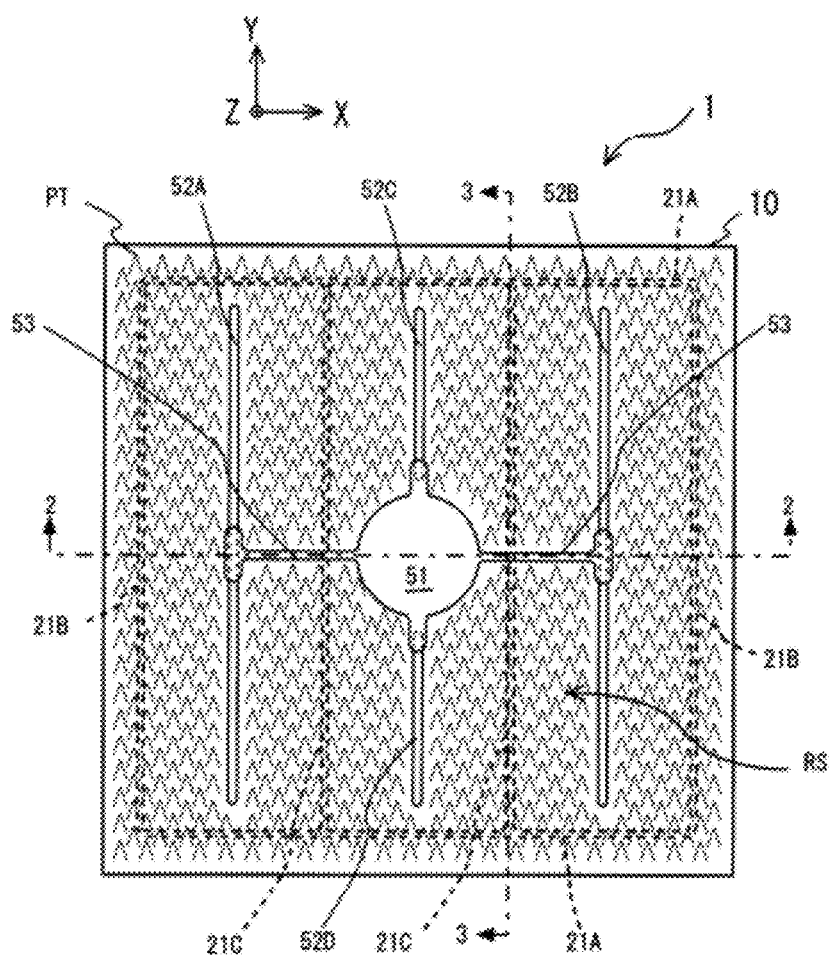
FIG. 1 is a schematic plan view showing an Example of a semiconductor light-emitting element made in accordance with principles of the presently disclosed subject matter.
Figure 2:
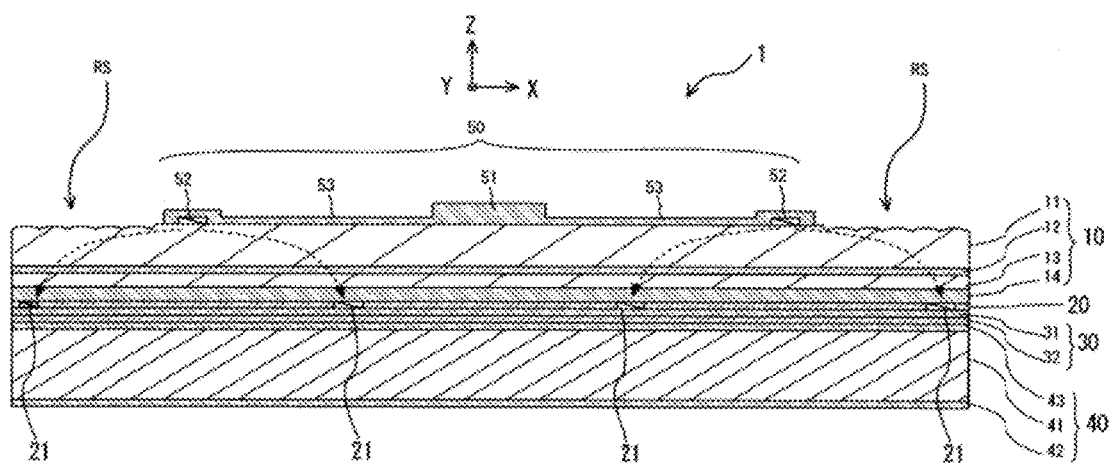
FIG. 2 is a cross-sectional view taken along line 2-2 in FIG. 1.
Figure 3:
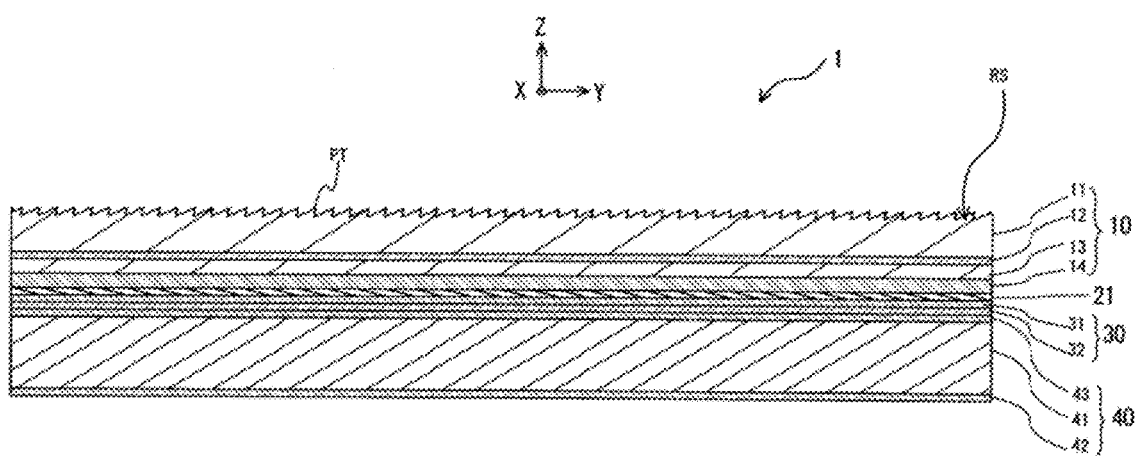
FIG. 3 is a cross-sectional view taken along line 3-3 in FIG. 1.
Figure 4:
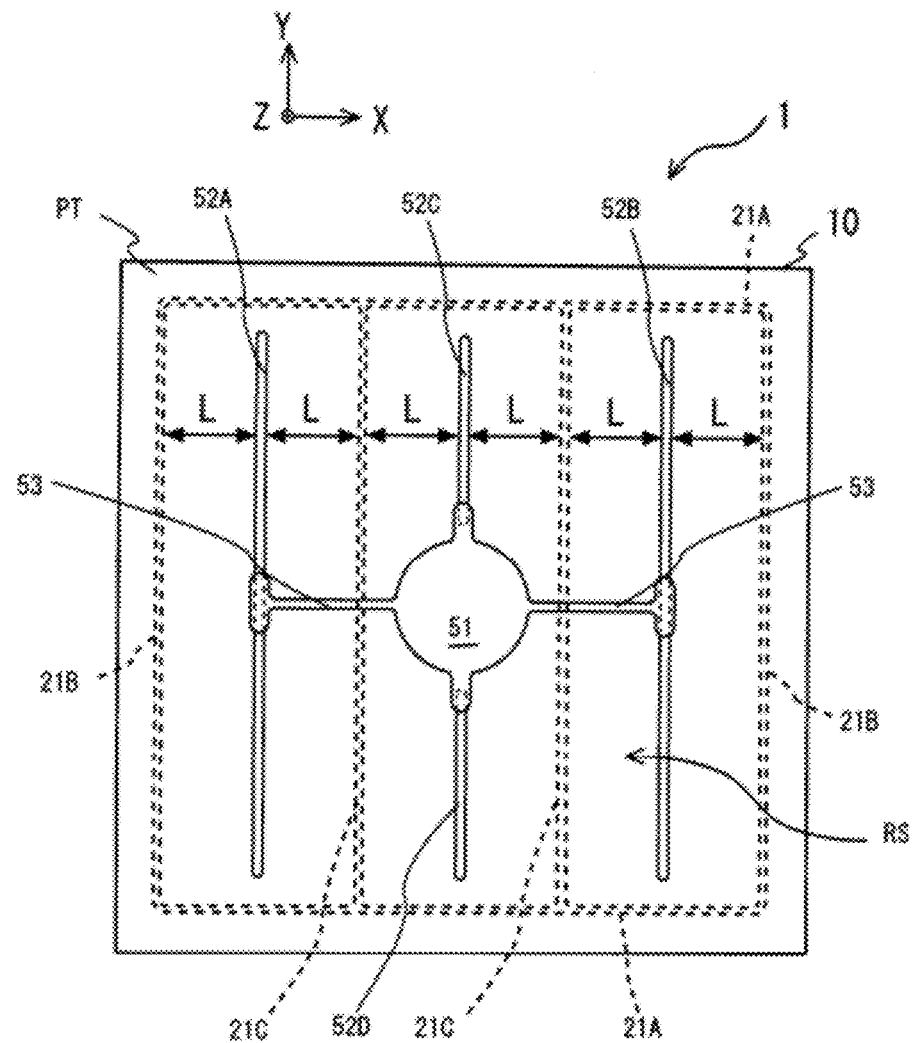
FIG. 4 is a schematic plan view showing the surface electrode configuration and the contact electrode configuration on the reflection surface side of the semiconductor light-emitting element Example in FIG. 1 while the roughened surface is omitted.
Figure 5:
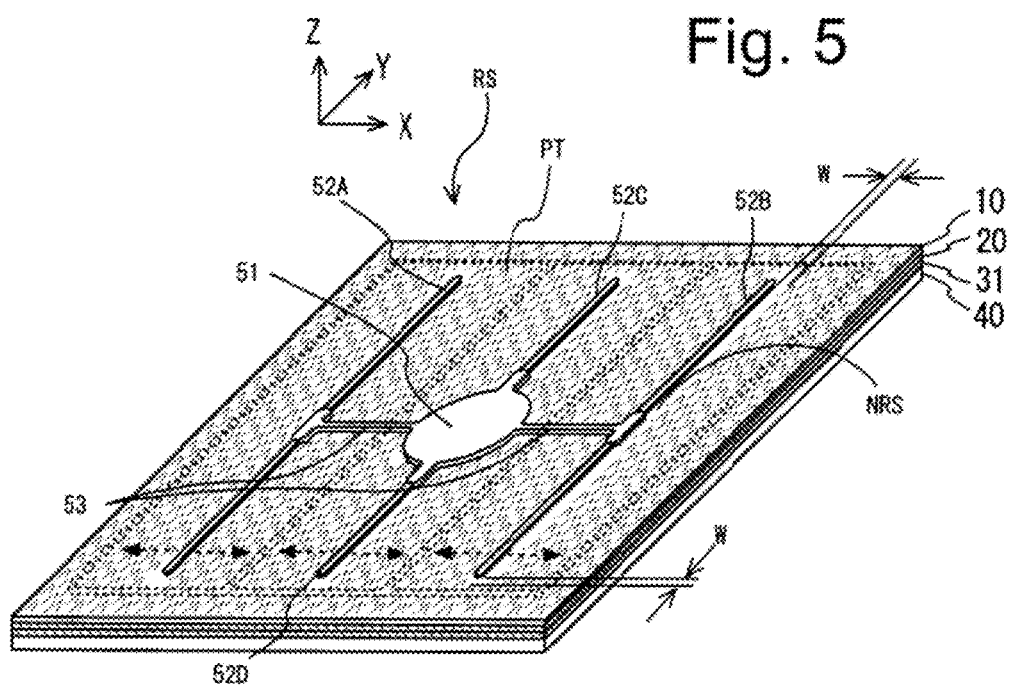
FIG. 5 is a schematic perspective view of the Example semiconductor light-emitting element made in accordance with principles of the presently disclosed subject matter.

FIG. 1 is a plan view of an Example of a semiconductor light-emitting element 1 made in accordance with principles of the presently disclosed subject matter. FIG. 2 is a cross-sectional view taken along line 2-2 in FIG. 1 (showing a dashed line). FIG. 3 is a cross-sectional view taken along line 3-3 in FIG. 1 (showing a dashed line). FIG. 4 is a schematic plan view showing the surface electrode configuration of the semiconductor light-emitting element of FIG. 1 (the electrode on the reflection surface side as the first electrode and the surface electrode as the second electrode to be described later). FIG. 5 is a schematic perspective view of the Example semiconductor light-emitting element.

As shown in FIGS. 1 to 3, the semiconductor light-emitting element 1 can include a semiconductor light-emitting stacked body 10, a reflection insulating layer 20, a contact electrode 21 as the first electrode, a junction film 30, a support medium 40, a surface electrode 50 as the second electrode (including a Schottky electrode 51 and an ohmic electrode 52 (surface electrode pieces 52A to 52D or the second electrode piece)), and a connection wiring 53. The semiconductor light-emitting element 1 can include a bonded structure in which the semiconductor light-emitting stacked body 10 and the support medium 40 are joined together via the reflection insulating layer 20 and the junction film 30.

As shown in FIGS. 1 to 5, the semiconductor light-emitting element 1 can include a roughened surface RS having a plurality conical projections PT formed on the semiconductor light-emitting stacked body 10 between the surface electrode pieces 52A to 52D. The plurality of conical projections PT can be oriented so that the projections can each have an extension axis of which direction crosses a direction perpendicular to the lengthwise extension direction of the first electrode pieces 52A to 52D and the reflection surface-side electrode piece. In the drawings, each conical projection PT is illustrated by segments crossing by an acute angle, but the illustrated size and dimension are not actual ones. Further, the longitudinal extension direction of the surface electrode pieces 52A to 52D is regarded as a Y direction and the direction perpendicular to the Y direction is regarded as an X direction, and the direction perpendicular to the X-Y plane is regarded as a Z direction. The conical projections PT and the roughened surface RS will be described later.

As shown in FIG. 2, the semiconductor light-emitting stacked body 10 can include a structure obtained by sequentially stacking an n-type cladding layer 11, an active layer 12, and a p-type cladding layer 13 from the light extraction surface side.

The n-type cladding layer 11 can be a $(Al_{0.7}Ga_{0.3})_{0.5}In_{0.5}P$ layer doped with Si and having a thickness of 3 μm (carrier concentration: $1\times10^{18}$ cm$^{-3}$). Note that the n-type contact layer can be stacked on the n-type cladding layer on the electrode side so as to be in contact with the Schottky electrode 51, the ohmic electrode 52, and the connection wiring 53.

The active layer 12 can have a multi quantum well structure, for example, composed of AlGaInP. The active layer 12 can be formed by stacking a well layer formed from $(Al_{0.1}Ga_{0.9})_{0.5}In_{0.5}P$ and having a thickness of 10 nm and a barrier layer formed from $(Al_{0.5}Ga_{0.5})_{0.5}In_{0.5}P$ and having a thickness of 10 nm and repeating this stacking process 15 times. Note that the Al composition of the well layer can be adjusted within the range of $0 \leqq z \leqq 0.4$ in accordance with the light-emission wavelength.

The p-type cladding layer 13 can be an $Al_{0.5}In_{0.5}P$ layer having a thickness of 1 μm and doped with Mg (carrier concentration: $5\times10^{17}$ cm$^{-3}$).

The p-type contact layer 14 can be a GaP layer having a thickness of 1 μm and doped with Mg (carrier concentration: $3\times10^{18}$ cm$^{-3}$). The addition of In to the p-type contact layer can adjust the properties within a range that the light from the active layer 12 is not absorbed.

The reflection insulating layer 20 can be provided in contact with the p-type contact layer 14, and the junction film 30 can be provided in contact with the reflection insulating layer 20. Note that the above first semiconductor layer corresponds to the p-type cladding layer 13 and the p-type contact layer and the above second semiconductor layer corresponds to the n-type cladding layer 11. The presently disclosed subject matter is not limited to these materials and the number of layers so long as the active layer is interposed between materials that have a large energy gap as compared to the active layer.

The support medium 40 can be composed of a support substrate 41 and ohmic metal layers 42 and 43 formed on respective sides of the support substrate 41. The support substrate 41 can be a Si substrate to which conductivity is imparted by adding, for example, a p-type impurity in a high concentration. The ohmic metal layers 42 and 43 can be made of Pt, for example. The second joining layer 32 can be provided on the ohmic metal layer 43. Note that examples of the material for the support substrate 41 may include, in addition of Si, Ge, Al, Cu and the like conductive materials.

The reflection insulating layer 20 can be a dielectric reflection film formed from a dielectric layer of, for example, $SiO_2$. In order to provide an electrical contact in part at both the boundaries of the reflection insulating layer 20 (the p-type contact layer 14 side and the junction film 30 side), there can be formed a through hole penetrating through the reflection insulating layer 20 by use of an etching method and into which a contact electrode 21 formed of AuZn, for example, is inserted. Note that examples of the material for the reflection insulating layer 20 include, in addition to $SiO_2$, $Si_3N_4$, $Al_2O_3$, and other transparent dielectric materials. The dielectric layer can be formed by a thermal CVD method, a sputtering method, and the like. The multilayer film of the dielectric layer can be etched by a dry etching method. The contact electrode 21 can be in contact with the p-type contact 14 via the opening of the reflection insulating layer 20 by an ohmic contact. Examples of the material for the contact electrode 21 may include, in addition to AuZn, any materials that can form an ohmic contact with the p-type cladding layer 13. The reflection insulating layer 20 formed of dielectric can form a reflection face at the boundary with the semiconductor light-emitting stacked body 10 and can reflect light emitted from the active layer 12 to the light extraction surface. The contact electrode 21 can supply a current to the semiconductor light-emitting stacked body 10, and will be described in detail later.

A first junction layer 31 with a double layer structure composed of a barrier metal layer and an eutectic soldering layer (both not shown) can be provided to the reflection insulating layer 20 on the support substrate 41 side so as to be in contact with the contact electrode 21. Further, a second junction layer 32 can be provided on the support medium 40 so as to be in contact with the first junction layer 31. The junction film 30 can be composed of the first junction layer 31 and the second junction layer 32. The barrier metal layer can be composed of a single layer or two or more layer including Ta, Ti, W, or other high-melting-point metal or a nitride thereof. The barrier metal layer can prevent the diffusion of Zn included in the contact electrode 21 as well as the diffusion of the eutectic material (for example, AuSn) included in the second junction layer 32 into the contact electrode 21. The eutectic soldering layer can include Ni and Au, for example. The Ni and Au can function to improve the wettability to the eutectic material contained in the second junction layer 32 when the first junction layer 31 and the second junction layer 32 are joined together. In this manner, the joining of the support medium 40 and the semiconductor light-emitting stacked body 10 can be facilitated. Although not illustrated, part of the junction layers 31 and 32 can be diffused and mixed together to form the junction film 30. The second junction layer 32 can be, for example, a metal layer containing Ti, Ni, AuSn, or the like.

The Schottky electrode 51 and the ohmic electrode 52 that form the surface electrode can be formed on the surface of the n-type cladding layer 11 that serves as the light extraction surface. The Schottky electrode 51 can form a bonding pad, and can be formed of a material that can form a Schottky contact with the n-type cladding layer 11, such as Ta, Ti, W, or an alloy thereof. The Schottky electrode 51 may be formed of, in addition to a metal material, an insulation dielectric such as $SiO_2$. An Au layer may be formed on top of the Schottky electrode 51 in order to improve the wire bondability and conductivity. The ohmic electrode 52 can be formed of a material that can form an ohmic contact with the n-type cladding layer 11, such as AuGeNi, AuSn, AuSnNi, and the like. The Schottky electrode 51 and the ohmic electrode 52 can be electrically connected with each other via a connection wiring 53 connecting therebetween. The connection wiring 53 can be formed of the same material (excluding one with insulation property) as that for the Schottky electrode 51 to form a Schottky contact with the n-type cladding layer 11. Since the Schottky electrode 51 forms the Schottky contact with the n-type cladding layer 11, a current cannot be supplied to the portion of the semiconductor light-emitting stacked body 10 immediately below the Schottky electrode 51. Namely, a current can flow between the ohmic electrode 52 and the contact electrode 21. In FIG. 2, the current path from the ohmic electrode (n-electrode) 52 to the contact electrode (p-electrode) 21 is shown by dotted arrows. The Schottky electrode 51 and the ohmic electrode 52 will be detailed later.

Next, a description will be given of the configuration of each electrode on the light extraction surface side and the opposite surface side.

FIG. 4 is a plan view, in order to facilitate the understanding, omitting the roughed surface composed of a plurality of conical projections PT on the semiconductor light-emitting stacked body 10 of the element 1.

The plane shape of the semiconductor light-emitting element 1 can be a square shape with one side of 310 μm. The Schottky electrode 51 can be a circular shape with a diameter of 100 μm and disposed at the center of the surface of the semiconductor light-emitting stacked body 10. The ohmic electrode 52 can be composed of linear surface electrode pieces 52A and 52B, and surface electrode pieces 52C and 52D. The linear surface electrode pieces 52A and 52B can be parallel with two opposite sides of the semiconductor light-emitting element on both the sides of the Schottky electrode 51 interposed therebetween. The surface electrode pieces 52C and 52D can be parallel with the linear surface electrode pieces 52A and 52B and disposed along a center line passing through the Schottky electrode 51. The surface electrode pieces 52A to 52D can be electrically connected with the Schottky electrode 51 via the connection wirings 53. The line width of each electrode piece may be 10 μm or smaller, and 5 μm or smaller in order to reduce the coverage. In the present exemplary embodiment, the line width of each electrode piece can be set to 5 μm and the diameter of the Schottky electrode 51 can be set to 100 μm, for example. The connection wiring 53 can be a thin line extending from the Schottky electrode 51 with a cross shape (extending in the X and Y directions).

The contact electrode 21 (namely, the above first electrode) can be a linear shape with a width of 5 μm, and composed of three consecutive reflection surface electrode pieces (namely, the above first electrode pieces). The contact electrode 21 can be composed of first reflection surface electrode pieces 21A each extending along the outer peripheral edge of the semiconductor light-emitting element and in the X direction, second reflection surface electrode pieces 21B each extending along the outer peripheral edge of the semiconductor light-emitting element and in the Y direction, and third reflection surface electrode pieces 21C each extending in the Y direction so as to connect the first reflection surface electrode pieces 21A with each other. With this configuration, the first reflection surface electrode pieces 21a can be formed in parallel with the peripheral edge extending in the X direction of the semiconductor light-emitting element, and the second and third reflection surface electrode pieces 21B and 21c can be formed in parallel with the peripheral edge extending in the Y direction of the semiconductor light-emitting element. Further, the area defined by the first and second reflection surface electrode pieces 21A and 21B can be divided into three sections by the two third reflection surface electrode pieces 21C. Note that the contact electrode 21 can have a continuous form to connect the respective constituent parts of the first to third reflection surface electrode pieces 21A to 21C with each other.

As shown in FIG. 4, the Schottky electrode 51 can be disposed at the center of the sections, and the surface electrode pieces 52A to 52D (or the second electrode pieces) can be disposed in parallel with the second and third reflection surface electrode pieces 21B and 21C. The surface electrode pieces 52A to 52D, the second reflection surface electrode piece 21B, and the third reflection surface electrode piece 21C can be separately disposed at predetermined intervals. Namely, the distance between the second reflection surface electrode piece 21B and the surface electrode piece 52A (horizontal interelectrode distance L), the distance between the third reflection surface electrode piece 21C and the surface electrode piece 52A (horizontal interelectrode distance L), the distance between the third reflection surface electrode piece 21C and the surface electrode piece 52C (52D) (horizontal interelectrode distance L), the distance between the third reflection surface electrode piece 21C and the surface electrode piece 52B (horizontal interelectrode distance L), and the distance between the second reflection surface electrode piece 21B and the surface electrode piece 52B (horizontal interelectrode distance L) can be the same. Herein, the "horizontal interelectrode distance" means a distance between an assumed virtual projection of the ohmic electrode 52 and the contact electrode 21 onto a plane parallel to the main surface of the semiconductor light-emitting stacked body 10 (i.e., the x component of a distance between the structures). Accordingly, the distance L does not mean the actual distance in consideration with the thickness of the semiconductor light-emitting stacked body 10.

In the present exemplary embodiment, the wiring shape of the contact electrode 21 can be patterned such that the shape can be rotational symmetric (two-times rotation) around the center of the semiconductor light-emitting device 1.

The contact electrode 21 can be disposed on both sides of the ohmic electrodes 52. Namely, the contact electrode 21 can be formed to surround the ohmic electrode 52 and the respective electrode pieces of the ohmic electrode 52 can be disposed at the respective centers of the sections surrounded by the contact electrodes 21.

As described above, the semiconductor light-emitting element 1 can have the ohmic electrode 52 and the contact electrode 21 that are disposed in such a manner that they are not overlapped with each other in the thickness direction of the semiconductor light-emitting stacked body 10, thereby constituting the counter electrode. First, the semiconductor light-emitting element 1 with the MB structure can be configured such that the thickness of the semiconductor light-emitting stacked body is extremely small as compared with the distance between the ohmic electrode 52 and the contact electrode 21 when viewed from above. When comparing the current path in the in-plane (X-Y) direction with the current path in the vertical (Z) direction, the in-plane current path is dominant. (current path in the vertical direction<<current path in the in-plane direction). With regard to the arrangement of the counter electrode, the reflection surface electrode pieces 21B and 21C can be disposed in parallel with the surface electrode pieces 52A and 52B, thereby generating the current path passing between the surface electrode pieces 52A and 52B and the reflection surface electrode pieces 21B and 21C with the shortest distance while the current path extends in a direction perpendicular to the extension direction of these electrode pieces 52A, 52B, 21B and 21C as a predominant in-plane current path. Namely, the surface electrode pieces and the reflection surface electrode pieces in the counter electrode can be disposed in parallel to each other, and therefore, the current path in the in-plane direction can be adjusted so as to predominantly extend in a single direction perpendicular to the electrode pieces. Note that a current path may be generated in between the reflection surface electrode piece 21A and the surface electrode pieces 52A and 52B, thereby generating current paths other than the direction perpendicular to the extension direction of the electrode pieces 52A, 52B, 21B and 21C. With this electrode configuration, the area of the ohmic electrode 52 can be reduced, thereby being able to diffuse the current widely over the semiconductor layer 10. Accordingly, the coverage of the electrode in the light extraction surface, and the light extraction efficiency can be improved. Further, with the above counter electrode configuration, the distance between the electrode close to the light extraction surface and the electrode close to the opposite surface can be shortened, thereby being able to reduce the forward voltage.

As shown in FIG. 5, the plurality of conical protrusions PT on the roughened light extraction surface RS can be oriented substantially perpendicularly with respect to the main current path. When the main direction of the main current path shown by the dotted arrows is referred to as X direction and the extension direction of the surface electrode pieces 52A and 52B and the reflection surface electrode pieces 21B and 21C is referred to as Y direction, the plurality of conical projections PT (the main axes thereof) can be oriented in an inclined direction or crossing direction with respect to the X direction perpendicular to the elongation (extending) direction of the reflection surface electrode pieces 21B and 21C and the surface electrode pieces 52A to 52D. Accordingly, the main direction of the current path and the direction of the projection can be controlled, and therefore, the projections oriented in the current path (X direction) in the roughened surface RS do not exist. This can prevent electro field concentration at the tip of the projections PT, thereby improving the electro static withstanding voltage of the element.

Figure 6:
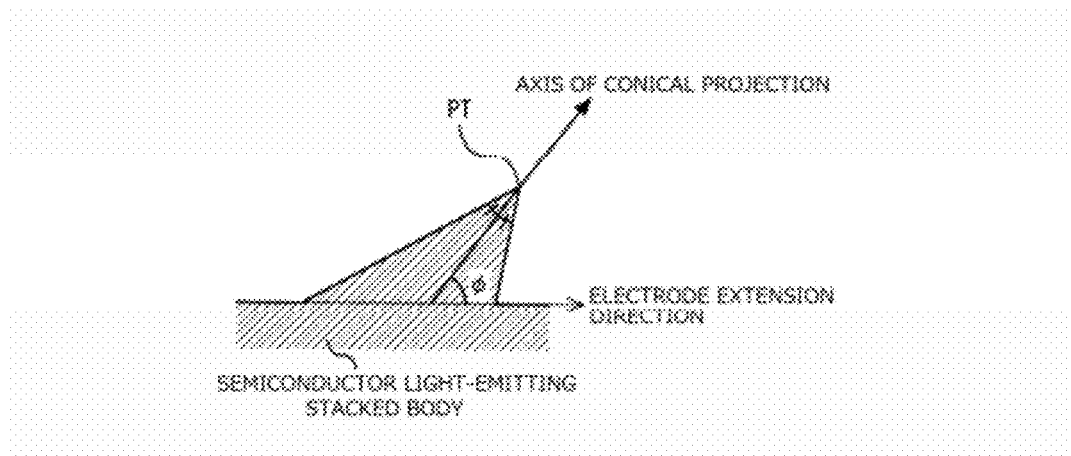
FIG. 6 is a schematic cross-sectional view illustrating the inclined direction of the conical projection on the roughened surface of a semiconductor light-emitting element made in accordance with principles of the presently disclosed subject matter.

Herein, the axis of the conical projection PT can be an axis connecting the center of gravity on the bottom surface of the projection (plane parallel to the support substrate) and the apex of the projection (which can be referred to as the extension axis, although not necessarily the longest axis of the structure). When it is difficult to define the bottom surface of the conical projection or the center of gravity in the bottom surface, as shown in FIG. 6, the semiconductor light-emitting stacked body is assumed to be cut along the electrode extension direction so that the cross-section include the apex of the conical projection PT and define the main current path, and a line segment bisecting the apex angle of the projection is assumed and the bisecting line segment can be considered as to be an axis of the conical projection PT.

The angle formed between the axis of the conical projection PT and the direction of the main current path can be set to 90 degrees±26 degrees. The axis direction of the projection is made substantially perpendicular to the main current path direction, thereby preventing the electric field concentration to the tip of the projection.

Figure 7:
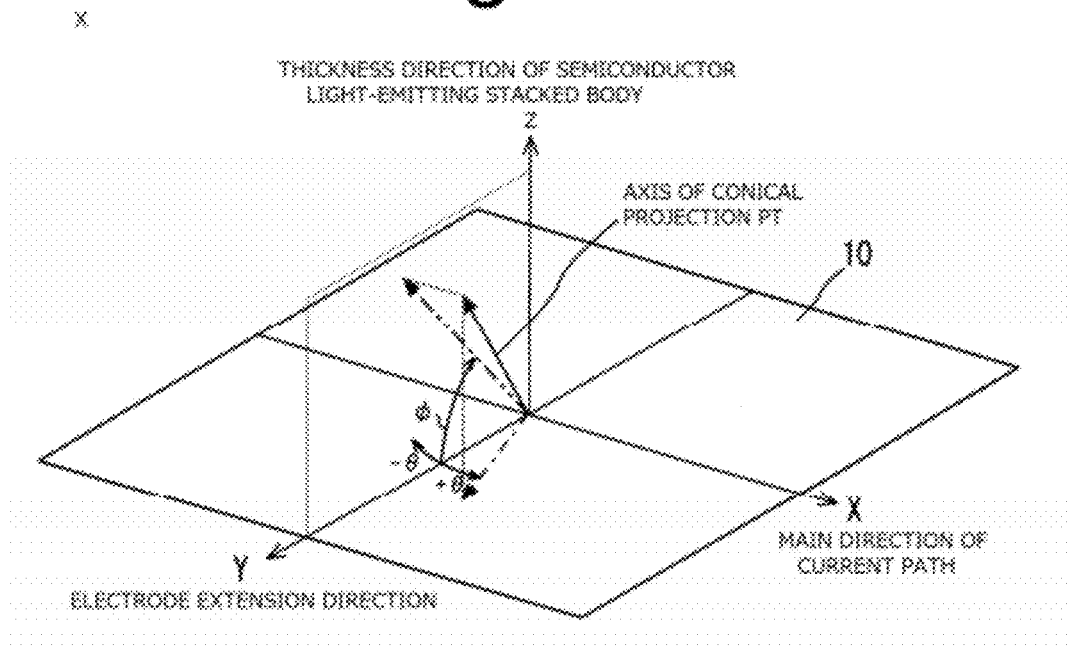
FIG. 7 is a schematic cross-sectional view illustrating the inclined direction of the conical projection on the roughened surface of the Example semiconductor light-emitting element made in accordance with principles of the presently disclosed subject matter.

The axis of the conical projection in the semiconductor light-emitting stacked body of the support substrate can be oriented to 90 degrees±26 degrees with respect to the main current path, and accordingly, the axis of the conical projection can be oriented to ±26 degrees with respect to the extension direction of the reflection surface electrode pieces and the surface electrode pieces that are parallel to each other. As shown in FIG. 7, the angle θ formed by the axis of the conical projection PT on the X-Y plane can be ±26 degrees with respect to the longitudinal extension direction of the counter electrode (the extension direction of the reflection surface electrode pieces 21B and 21C and the surface electrode pieces 52A to 52D) and possibly±10 degrees. In FIG. 7, the X axis corresponds to the main direction of the current path, the Y axis corresponds to the extension direction of the electrode, and the Z axis corresponds to the thickness direction of the semiconductor light-emitting stacked body. The inclination of the axis of the conical projection PT can be represented by the angle θ of the projected image (shown by an arrow with an alternate long and short dash line) of the axis of the conical projection PT on the X-Y plane with respect to the Y axis and the angle Φ of the projected image (shown by an arrow with an alternate long and two short dash line) of the axis of the conical projection PT on the Y-Z plane with respect to the Y axis.

When the inclination angle Φ of the conical projection PT is assumed to be an angle between the axis of the conical projection PT and the plane of the support substrate 40, the inclination angle Φ is not particularly limited so long as it is less than 90 degrees.

When the element of the present exemplary embodiment was confirmed as to the relation between the inclination angle Φ and the luminance and between the inclination angle Φ and the electrostatic withstanding voltage with the inclination angle of the projection varied, the high light extraction efficiency and the high electrostatic withstanding voltage could be achieved in a range of the inclination angle Φ of the conical projection PT of 40 degrees or more and 62 degrees or less.

The inclination angle Φ of the conical projection PT is not limited to 40 degrees≦Φ≦62 degrees, but the high electrostatic withstanding voltage could be achieved in a range of 0 degrees≦Φ≦80 degrees. When considering achieving both high light extraction efficiency and the high electrostatic withstanding voltage, the range of 30 degrees≦Φ≦70 degrees works efficiently.

In the present exemplary embodiment, the semiconductor light-emitting element can be composed of the junction layer, the reflection layer, and the semiconductor light-emitting stacked body (the first semiconductor layer, the active layer, and the semiconductor layer), and the reflection surface side electrodes (the reflection surface electrode pieces, namely, the first electrode pieces) and the light extraction surface side electrodes (the front surface electrode pieces, namely, the second electrode pieces) are disposed on both sides of the semiconductor light-emitting stacked body. Further, these electrodes can face towards each other when viewed from above, thereby forming the MB structure. In this manner, the current path within the X-Y plane of the semiconductor light-emitting stacked body can be controlled to be in a single direction. In addition to this, in the present exemplary embodiment the structure of the projections formed by roughening the light extraction surface of the semiconductor layer can be configured such that the tip end of the projection is directed perpendicular to the main direction of the current path of the counter electrode and oriented in a single axis direction (vertical direction).

The projections are not particularly limited so long as the axes thereof are perpendicular to the main direction of the current path (the allowance is ±26 degrees), and the sizes and arrangement of the projections may be controlled constantly or randomly. However, the size of the projections can be in the range of 200 to 1000 nm in terms of the improved light extraction efficiency because when the size is less than ¼ the wavelength of the emitted light, the advantageous effects would be reduced, and when the size is several micrometers or more the current diffusion may be harmed.

It is desired that the distance between the projections produced by roughening and the electrodes be shortened as much as possible because the coverage due to the roughening of the light extraction surface can be improved. Tolerance during the manufacturing steps such as the positional accuracy of electrodes and the like is necessary, and it is possible to set the distance between the projection and the electrode to 3 μm or shorter and possibly to set to half the electrode width of the surface electrode pieces or shorter. The distance between the end of the projection and the end of the electrode, or the shortest distance between the projection on the roughened surface and the surface electrode piece can be a width W of the unroughened surface around the respective surface electrode pieces 52A to 52D (the electrode protection area NRS) as shown in FIG. 5. Since no projections directing towards the current path (X direction) exist by controlling the direction of the projection as well as the main direction of the current path, it is possible to narrow the electrode protection area in width W when compared with the case where the direction of the projection is not controlled with respect to the current path. Accordingly, even if the width W of the electrode protection area is narrowed, the electrostatic withstanding voltage will not be reduced.

Next, a description will be given of the method for producing the semiconductor light-emitting element. FIGS. 8A to 8D and 9A to 9D each are a cross-sectional view illustrating the method for producing the semiconductor light-emitting element.

[Forming the Semiconductor Light-Emitting Stacked Body]

The semiconductor light-emitting stacked body can be formed by a metalorganic chemical vapor deposition (MOCVD) method. The growth substrate for use in crystalline growth for semiconductor light-emitting stacked body can be an n-type GaAs substrate with a thickness of 300 μm and inclined by 15 degrees in the [011] direction from the (100) plane.

Figure 8A:
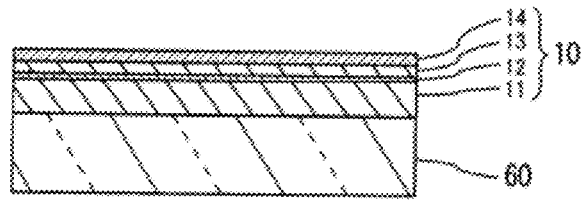
FIGS. 8A, 8B, 8C, and 8D are cross-sectional views illustrating a method for producing a semiconductor light-emitting element made in accordance with principles of the presently disclosed subject matter.

First as shown in FIG. 8A, the n-type cladding layer 11 with a thickness of 3 μm can be formed on the growth substrate 60. For example, the n-type cladding layer 11 can be formed by depositing a $(Al_{0.7}Ga_{0.3})_{0.5}In_{0.5}P$ layer doped with Si (carrier concentration: $1 \times 10^{18}$ cm$^{-3}$) on the growth substrate 60. Next, the active layer 12 can be formed on the n-type cladding layer 11. The active layer 12 can be formed by repeating the alternate deposition of a well layer formed from $(Al_{0.1}Ga_{0.9})_{0.5}In_{0.5}P$ and having a thickness of 10 nm and a barrier layer formed from $(Al_{0.5}Ga_{0.5})_{0.5}In_{0.5}P$ and having a thickness of 10 nm fifteen times.

Next, the p-type cladding layer 13 can be formed by depositing a $Al_{0.5}In_{0.5}P$ layer having a thickness of 1 μm and doped with Mg (carrier concentration: $5 \times 10^{17}$ cm$^{-3}$) on the active layer 12. Then, the p-type contact layer 14 can be formed by depositing a GaP layer having a thickness of 1 μm and doped with Mg (carrier concentration: $3 \times 10^{18}$ cm$^{-3}$) on the p-type cladding layer 13.

In this manner, the respective layers can constitute the semiconductor light-emitting stacked body 10 as shown in FIG. 8A.

Phosphine (PH$_3$) can be used as a V group raw material, and organic metals including trimethyl gallium (TMGa), trimethyl aluminum (TMAl) and trimethyl indium (TMI) can be used as a III group raw material. Silane (SiH$_4$) can be used as a Si raw material used as an n-type impurity, and biscyclopentadienyl magnesium (Cp$_2$Mg) can be used as a Mg raw material used as a p-type impurity. The growth temperature can be 750 to 850° C., hydrogen gas can be used as a carrier gas, and the growth pressure can be 10 kPa, for example.

The present exemplary embodiment can employ the AlGaInP-based components, but the presently disclosed subject matter is not limited thereto. InGaN-based materials and other materials can appropriately be used.

In the present exemplary embodiment, the growth substrate can be inclined by 15 degrees (off angle), but the presently disclosed subject matter is not limited thereto. The off angle may be any angle as long as the AlGaInP material can be grown on the substrate, and for example, a substrate with an off angle of 4 degrees was confirmed to be used as a growth substrate according to a confirmation test example performed by the present inventors. In the step of producing the below-described light extraction structure, when considering the formation of the projection by anisotropic etching, the use of an off substrate with an off angle of 10 degrees or larger and 25 degrees or smaller can assist the manufacture of the projections with an inclination angle to achieve the higher light extraction efficiency. Accordingly, this range of the off angle may sometimes be desired.

In the present exemplary embodiment, the substrate inclined toward the [011] direction from the (100) plane can be used as a growth substrate, but the presently disclosed subject matter is not limited to the (100) plane. For example, substrates can be inclined to any directions from the equivalent crystalline plane of {100} plane (including the (100), (−100), (010), (0-10), (001), and (00-1) planes).

[Forming the Reflection Insulating Layer]

Figure 8B:
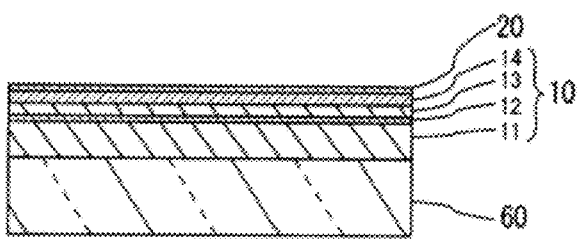
Figure 8C:
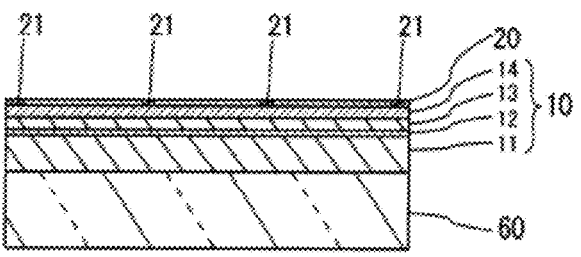

Next, as shown in FIG. 8B, a $SiO_2$ film constituting the reflection insulating layer 20 above the p-type contact layer 14 can be formed on the p-type cladding layer 13 by a plasma CVD method.

[Forming the Contact Electrode on the Reflection Surface Side]

Next, a resist mask is formed on the $SiO_2$ reflection insulating layer 20 to form a predetermined opening pattern. An etching process with a buffered HF (BHF) can be performed on the reflection insulating layer 20 to form through holes corresponding to the pattern for contact electrodes in the reflection insulating layer 20. This can expose the p-type contact layer 14 at the openings. Then, AuZn can be filled in by a known deposition technique such as a resistance heating deposition, sputtering, EB deposition and the like to form the contact electrodes 21. Then, the resist mask is removed to form the structure in which the contact electrodes 21 are in contact with the p-type contact layer 14 at the through holes formed in the reflection insulating layer 20. Then, the reflection surface side contact electrode can be arranged so as to form the linear reflection surface side electrode pieces to define the main current path.

[Forming the First Junction Layer]

Next, TaN (layer thickness: 100 nm), TiW (layer thickness: 100 nm), and TaN (layer thickness: 100 nm) can be sequentially deposited on the reflection insulating layer 20 by a sputtering method to form a barrier metal layer. Note that the barrier metal layer can be composed of a single layer or two or more layers including other high-melting point metal such as Ta, Ti and W or nitrides thereof. The formation of the barrier metal layer may be performed by an EB deposition method. Then, the product can be subjected to heat treatment under nitrogen atmosphere at about 500° C. In this manner, a favorable ohmic contact can be formed between the contact electrode 21 and the p-type contact layer 14.

Figure 8D:
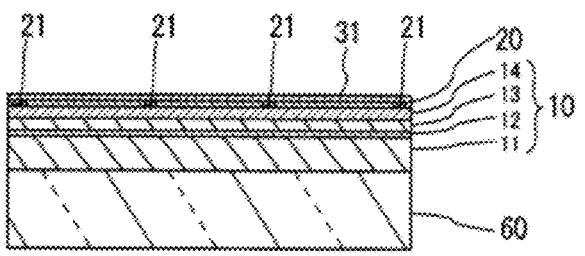

Next, Ni (layer thickness: 300 nm) and Au (layer thickness: 30 nm) can be sequentially formed on the barrier metal layer by a known deposition method such as a resistance heat deposition method, sputtering method or EB deposition method to form an eutectic solder layer. In this manner, as shown in FIG. 8D, the first junction layer 31 including the barrier metal layer and the eutectic solder layer can be formed on the reflection insulating layer 20.

[Joining the Support Substrate]

Next, the support medium 40 for supporting the semiconductor light-emitting stacked body 10 can be formed. For example, a Si substrate to which conductivity has been imparted by adding a p-type impurity is prepared as a support substrate 41, and then, ohmic metal layers 42 and 43 formed of Pt and having a thickness of 200 nm can be deposited on both sides of the support substrate 41 by an EB deposition method. In this manner, the support medium 40 composed of the support substrate 41 and the ohmic metal layers 42 and 43 can be formed. Note that the ohmic metal layers 42 and 43 can be formed of materials other than PT capable of forming an ohmic contact with the Si substrate, such as Au, Ni, Ti and the like. Further, the support substrate 41 can be composed of other material having conductivity and high heat conductivity, such as Ge, Al, Cu and the like.

Next, Ti (layer thickness: 150 nm), Ni (layer thickness: 100 nm) and AuSn (layer thickness: 600 nm) can be sequentially formed on the ohmic metal layer 43 by a sputtering method to form the second junction layer 32. The AuSn layer can be formed from a eutectic junction material, and is desired to be composed of 70 to 80 wt % of Au and 20 to 30 wt % of Sn. The Ni layer can have a function of improving wettability to the eutectic junction material. In place of Ni, NiV or Pt can be used. The Ti layer can have a function of improving an adhesion property to the ohmic metal layer 43 and Ni.

Figure 9A:
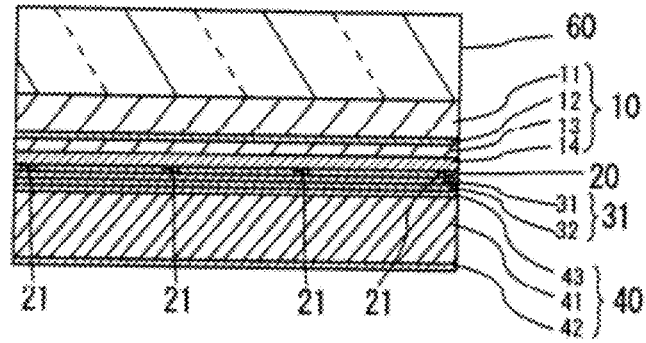
FIGS. 9A, 9B, 9C, and 9D are cross-sectional views illustrating a method for producing the Example semiconductor light-emitting element made in accordance with principles of the presently disclosed subject matter.

Next, the semiconductor light-emitting stacked body 10 and the support medium 40 can be joined together by thermal compression. The first junction layer 31 on the semiconductor light-emitting stacked body 10 side the second junction layer 32 on the support medium 40 side can be in close contact with each other and held in this state at 330° C. and a pressure of 1 MPa under nitrogen atmosphere. At that time, the eutectic junction material (AuSn) included in the second junction layer 32 on the support medium 40 side can be molten to form AuSnNi between the eutectic soldering layer (Ni/Au) on the semiconductor light-emitting stacked body 10 side. In this manner, the support medium 40 and the semiconductor light-emitting stacked body 10 can be joined to each other as shown in FIG. 9A. Namely, the thermal compression can form the junction film 30 composed of the first junction layer 31 and the second junction layer 32.

[Removing the Grown Substrate]

Figure 9B:
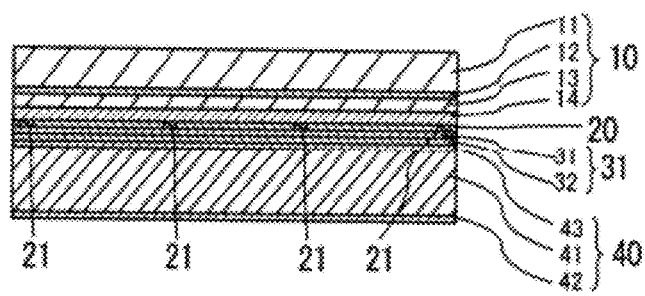

Next, wet etching can be performed on the growth substrate 60 for the crystal growth of the semiconductor light-emitting stacked body 10 using a mixed liquid of aqueous ammonia and hydrogen peroxide solution to remove the growth substrate 60 as shown in FIG. 9B. Examples of the method for removing the growth substrate 60 may include a dry etching method, a mechanical polishing method, a chemical mechanical polishing method, and the like.

[Forming the Light Extraction Surface Side Electrode]

Figure 9C:
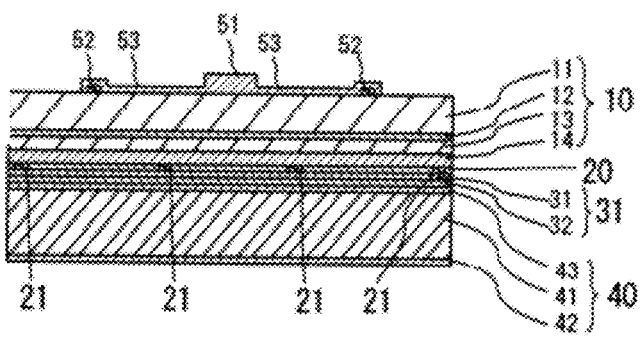

After removing the growth substrate 10, the n-type cladding layer 11 can be exposed. Then, the ohmic electrode 52, the Schottky electrode 51, and the connection wiring 53 can be formed on the n-type cladding layer 11. In order to define the main current path, the ohmic electrode 52 can be arranged so that the linear surface electrode pieces are formed to be parallel to the reflection surface side electrode pieces. For example, AuGeNi for forming the ohmic contact with the n-type cladding layer 11 can be deposited over the n-type cladding layer 11 by an EB deposition method. Then, the lift off method can be carried out to pattern for forming the ohmic electrode 52. Subsequently, Ti (100 nm) can be deposited over the n-type cladding layer 11 by an EB deposition method to form a Schottky contact with the n-type cladding layer 11, and Au (1.5 µm) can be deposited over the formed Ti. Then, patterning by a lift off method can be carried out to form the Schottky electrode 51 and the connection wiring 53 over the n-type cladding layer 11 as shown in FIG. 9C. Examples of the material for the ohmic electrode 52 may include AuGe, AuSn, AuSnNi, and the like. Examples of the material for the Schottky electrode 43 may include Ta, W, alloys of these elements, and nitrides thereof.

Next, in order to accelerate the formation of the ohmic contact between the n-type cladding layer 11 and the ohmic electrode 52, heat treatment can be performed at 400° C. under nitrogen atmosphere.

[Forming the Light Extraction Structure]

Figure 9D:
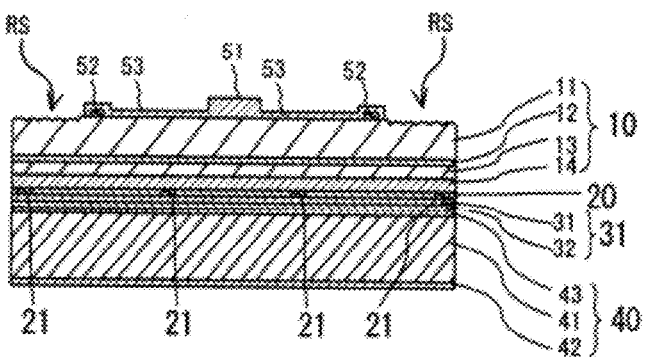

Then, the surface of the n-type cladding layer 11 can be subjected to microfabrication process to form the roughened surface RS with the light extraction structure for improving the light extraction efficiency. For example, a mask can be formed over the electrode formation area on the light extraction surface side (for the Schottky electrode 51, the ohmic electrode 52 and the connection wiring 53), and the surface of the n-type cladding layer 11 can be roughened by wet etching, thereby forming the roughened surface RS with the light extraction structure as shown in FIG. 9D. Then, the plurality of conical projections can be formed on the roughened surface RS by anisotropic etching so that the direction of the projections is oriented in one axial direction with respect to the main direction of the current path (approximately perpendicular to the main direction of the current path). Accordingly, the concentration of electric field at the tip end of the projection can be suppressed to improve the electrostatic withstanding voltage of the element. The anisotropic etching (roughening) will be described later.

A mask with an artificial cyclic structure can be formed on the n-type cladding layer 11 by photography and a lift-off method. Then, the plurality of conical projections can be formed on the surface of the n-type cladding layer 11 by dry etching, thereby forming the roughened surface RS with the light extraction structure. The conical projection can be arranged in a triangular grid form and at a cycle of 300 to 1000 nm (for example, 500 nm), with a height of 600 nm and an aspect ratio of 0.7 to 1.5 (for example, 1.0). Note that the formation of the mask pattern can be achieved by EB lithography, nanoimprinting or other microfabrication technique. The shape of the projection constituting the roughened surface RS of the light extraction structure can be a cylindrical or prismatic shape in addition to the conical shape.

As described above, the semiconductor light-emitting element 1 can be competed through the respective steps.

EXAMPLES

[Structure of the Semiconductor Light-Emitting Element Produced in the Present Example]

The semiconductor light-emitting element of the present example was produced on a semiconductor substrate formed from an n-type GaAs substrate, whose crystalline main axis was off by 15 degrees from the (100) direction. The n-type cladding layer of an n-type $(Al_{07}Ga_{0.3})_{0.5}In_{0.5}P$ layer (doped with Si and having a thickness of 3 μm, carrier concentration: $1\times10^{18}$ cm$^{-1}$); the active layer composed of AlGaInP (being a multi quantum well structure including a well layer formed from $(Al_{0.1}Ga_{0.9})_{0.5}In_{0.5}P$ and having a thickness of 10 nm and a barrier layer formed from $(Al_{0.5}Ga_{0.5})_{0.5}In_{0.5}P$ and having a thickness of 10 nm), the p-type cladding layer of an $Al_{0.5}In_{0.5}P$ layer (about 1 μm and doped with Mg, carrier concentration: $5\times10^{17}$ cm$^{-3}$), and the p-type contact layer of a GaP layer (about 1 μm and doped with Mg, carrier concentration: $3\times10^{18}$ cm$^{-3}$) were formed (see FIGS. 1 to 5).

Then, the semiconductor light-emitting element formed on the GaAs substrate was pasted to a Si support substrate made of a material different from the GaAs substrate via a multilayer metal junction layer including a AuSn layer by heat compression. A reflection insulating layer (SiO2) was introduced in between the semiconductor light-emitting element and the multilayer metal junction layer, and in order to achieve electrical contact, the reflection insulating layer was etched to be partly removed, and a contact layer of AuZn was inserted.

Then, the GaAs substrate for crystal growing was removed by an etching mixed liquid including ammonia and hydrogen peroxide. In this manner, the semiconductor light-emitting stacked body with the metal junction layer, the reflection insulating layer and the AlGaInP semiconductor stacked structure obtained by the crystal growing by the MOCVD method were formed on the Si support substrate.

An n-type GaAs substrate whose crystalline main axis was off by 15 degrees was used as the growth substrate. The off angle can take any value as long as AlGaInP can be grown. The present inventors have confirmed that the same advantageous effects can be obtained with the substrate whose crystalline main axis was off by 4 degrees. In addition, the layer thicknesses, the carrier concentrations of the above layers can be appropriately selected within a range where the advantageous effects can be obtained.

[Configuration of the Counter Electrode Produced in the Present Example]

In the present example, the ohmic electrode on the light extraction surface side and the contact electrode on the opposite side thereto for injecting a current into the semiconductor layer were arranged so as not to overlap with each other when viewed from above (see FIGS. 1 to 3).

The line width of each electrode piece may be set to 10 μm or less, and possibly 5 μm or less.

In the present example, the Schottky electrode on the light extraction side was formed to include a bonding pad portion with a diameter of 100 μm and thin lines extending therefrom in a cross shape. The electrode pieces of the ohmic electrode on the light extraction surface side was connected to the end of the thin line of the Schottky electrode and formed to be a linear thin line with a line width of 5 μm and parallel to each other. The contact electrode on the opposite side thereto was formed of linear electrode pieces and part thereof was arranged in parallel to the electrode pieces of the ohmic electrode on the light extraction surface side. With this configuration, the main direction of the current path within the plane of the semiconductor light-emitting stacked body was controlled to one direction.

Note that, when the projections on the light extraction surface were formed by anisotropic etching, the counter electrode was arranged such that the axes of the projections were aligned in the extending direction of the electrode piece defining the main current path.

[Configuration of the Projections Produced in the Present Example]

By utilizing the anisotropy possessed by the AlGaInP crystal, a roughened surface with a light extraction structure oriented in one direction was formed. The projections as a result of roughening of the light extraction surface can be produced by using a halogen-type etchant including Cl, Br, I or F (for example, etchant including HCl, HBr, Hi, $BCl_3$, $Cl_2$, HF and the like).

In the present example, the AlGaInP-based semiconductor light-emitting stacked body was grown using a GaAs growth substrate whose crystalline axis was off by 15 degrees from the (100) plane to the [011] direction. Since the growth substrate was peeled off from the semiconductor light-emitting stacked body after the stacked body was bonded to the support substrate, the surface of the stacked body (light extraction surface) included a surface whose crystalline axis was off by 15 degrees from the (−100) plane to the [0-1-1] plane. In this state, the light extraction surface was subjected to anisotropic etching (roughening) by etchant including HBr:

H$_2$O=1:3. Since the (111) B plane proceeded faster in etching than the (111) A plane, the (111) A plane was formed on the light extraction surface, thereby forming conical projections having a surface direction of (111) A plane on the (−100) plane.

In this manner, the conical projections formed by anisotropic etching were oriented in the vertical direction with respect to the main direction of the current path in the counter electrode.

The direction of the projections after roughening was parallel to the [011] direction on the (−100) plane of the light extraction surface (equivalent to the direction of [0-1-1]). When the long axis direction of the counter electrode is parallel with the [011] direction, it is perpendicular to the direction of the current path, thereby suppressing the electric field concentration. When the long axis direction of the counter electrode is perpendicular to the [011] direction, it is parallel to the direction of the current path, whereby the electric field concentrates to deteriorate the electrostatic withstanding voltage.

FIG. 10 is a micrograph of a roughened surface of the light extraction structure in which projections are oriented in one direction (Y direction) in the semiconductor light-emitting element, and its enlarged view and a photograph of the cross-section of the element. FIG. 10 includes notes for the crystal orientation of the produced element.

In the presently disclosed subject matter, the size of the projection was about 500 nm, but the presently disclosed subject matter is not limited to particular ones as long as the conical projections with the size of 200 to 1000 nm are formed. Note that when the size is less than ¼ the wavelength of the emitted light, certain advantageous effects may be reduced, and when the size is several micrometers or more the current diffusion may be harmed.

In the presently disclosed subject matter, the growth substrate was a substrate whose crystal axis was inclined from the (100) plane to the [011] direction, and accordingly, the surface exposed after removing the growth substrate and which is subjected to anisotropic etching for projection formation was a surface whose crystalline axis was off by 15 degrees from the (−100) plane to the (0-1-1) plane direction. However, the presently disclosed subject matter is not limited thereto and can employ substrates with a plane inclined in an arbitrary direction from the {100} plane. The inclined angle of the exposed surface from the {100} plane can be 10 degrees or larger and 25 degrees or smaller.

In the present example, since the surface inclined by 15 degrees from the (−100) plane to the (0-1-1) plane direction was subjected to etching, the difference in etching rate between the (111) A plane and (111) B plane was utilized. As described above, since the surface inclined in an arbitrary direction from the {100} plane can be subjected to etching, the difference in etching rate between the {111} A plane and the {111} B plane can be utilized.

[Configuration of the Electrode Protection Area on the Light Extraction Surface Produced in the Present Example]

When the step of roughening the light extraction surface by anisotropic etching is considered, the width W of the electrode protection area (see FIG. 5) can be as wide as possible. In terms of the improved light extraction efficiency, the width W of the electrode protection area can be narrow because the roughened area should be widened. In the present example, the width W of the electrode protection area at the surface electrode piece on the light extraction surface side was varied from 2.00 μm to 3.25 μm so as to produce 3 samples. The coverage of unroughened area was 10.8%, 11.4% and 13.8% for 2.00 μm, 2.25 μm, and 3.25 μm of the width, respectively.

[Relationship Between the Counter Electrode and the Conical Projection Other than the Present Example]

In the present example, the angle θ formed between the direction of the axis of the projection produced by roughening and the extension direction of the reflection surface side electrode pieces and the surface electrode pieces parallel to each other and defining the main direction of the current path of the counter electrode was substantially 0 degrees (parallel). However, the angle θ can vary within the range of 0 degrees±26 degrees, and can be in the range 0 degrees±10 degrees. Namely, the direction of the axis of the projection can fall within the range of 90 degrees±26 degrees with respect to the main direction of the current path, and can be 90 degrees±10 degrees.

Comparative Example 1

Roughening the Light Extraction Surface (Random)

In the comparative example 1, the projections were produced by roughening the light extraction surface with dry etching. The shape and size of the projections cannot be controlled, but randomly formed on the light extraction surface with respect to the main direction of the current path. The other processes were performed in the same manner as in the present example described above.

Further, the width W of the electrode protection area was adjusted to form three samples as in the present example.

Comparative Example 2

In the Case where the Inclination Angle of the Projection is not Perpendicular to the Current Path In the comparative example 2, the projections on the light extraction surface were produced by anisotropic etching so as to direct the projections parallel to the main direction of the current path of the counter electrode, and the other processes were performed in the same manner as in the present example. Further, the width W of the electrode protection area was adjusted to form three samples as in the present example (see FIG. 5).

[Relationship Between the Electrostatic Withstanding Voltage and Luminance in the Example and the Comparative Examples]

Dicing and chip separation were performed to separate individual light-emitting elements, which were die-bonded to stems and the electrodes on the light extraction surface were wire-bonded.

The resulting samples of the example and the comparative examples 1 and 2 with the varied widths W (2.00, 2.25 and 3.25 μm) were evaluated on the luminance and the electrostatic withstanding voltage.

The test for electrostatic withstanding voltage was performed in accordance with JESD22-A114-B, or JEDEC standard. The measured results were evaluated as follows. With regard to the luminance, the results for the element of the present example with the width W of 2.00 μm is assumed to be 1.0 as a reference for normalization, and with regard to the electrostatic withstanding voltage, the results for the element of the present example with the width W of 3.25 μm is assumed to be 1.0 as a reference for normalization. The normalized results were listed in the table of FIG. 11.

[Relationship Between the Electrostatic Withstanding Voltage and the Width W of the Electrode Protection Area]

Figure 12:
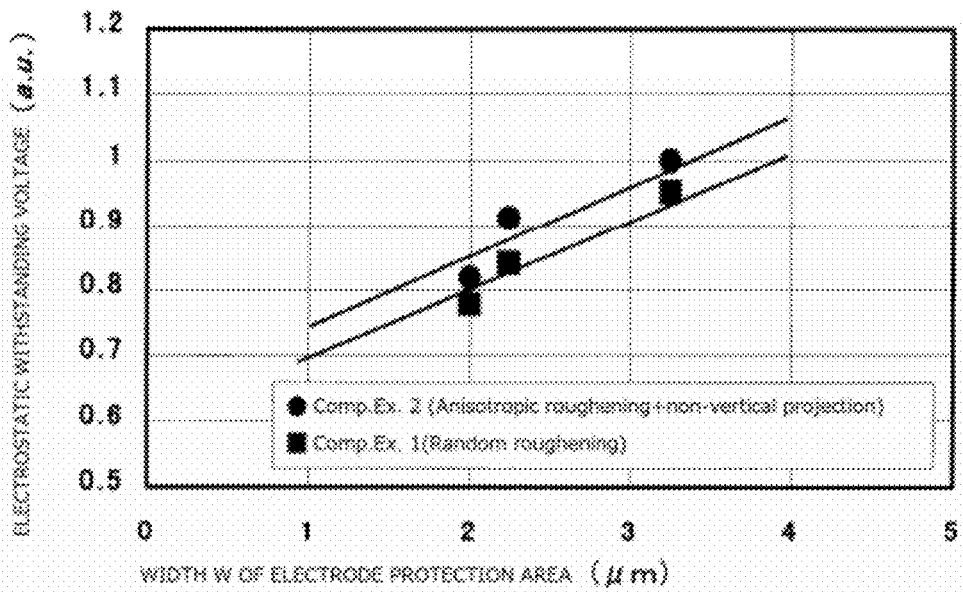
FIG. 12 is a graph showing the relationship between the electrostatic withstanding voltage and the width of the electrode protection area of the semiconductor light-emitting elements in Comparative Examples 1 and 2.

FIG. 12 is a graph showing the relationship between the electrostatic withstanding voltage and the width W of the electrode protection area (see FIG. 5) of the semiconductor light-emitting elements in the comparative examples 1 (the roughening of the light extraction surface was randomly performed) and 2 (the direction of the projection formed by anisotropic etching was not perpendicular but parallel to the main direction of the current path). The narrower the distance between the projection and the electrode, the lower the electrostatic withstanding voltage, showing that the electrostatic withstanding voltage lowers. This is because when the projections are directed in the electrode direction, the electric field concentrates, and if the distance between the projection and the electrode is shorter, the electrostatic breakdown will occur due to the higher current density.

Figure 13:
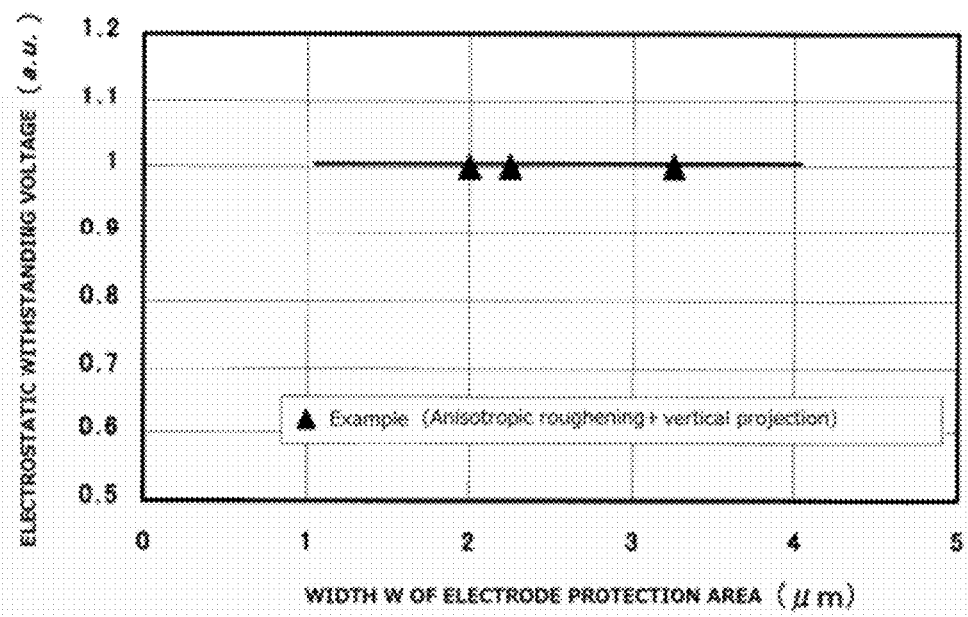
FIG. 13 is a graph showing the relationship between the electrostatic withstanding voltage and the width of the electrode protection area of the Example semiconductor light-emitting element made in accordance with principles of the presently disclosed subject matter.

Next, FIG. 13 shows the results of the present example wherein the roughening of the light extraction surface was carried out by using anisotropic etching to direct the direction of the axes of the projections perpendicular to the main direction of the current path. In this case, since the direction of the axis of the projections is controlled not to concentrate the electric field to the tip ends of the projections, even if the width W of the electrode protection area is narrowed, the electrostatic withstanding voltage does not lower. Accordingly, the direction of the projections is controlled to be in one direction with respect to the current path (approximately vertical direction to the main direction of the current path) as well as the current path is controlled in one direction, thereby suppressing the electric field and improving the electrostatic withstanding voltage.

[Relationship Between the Luminance and the Width W of the Electrode Protection Area]

Figure 14:
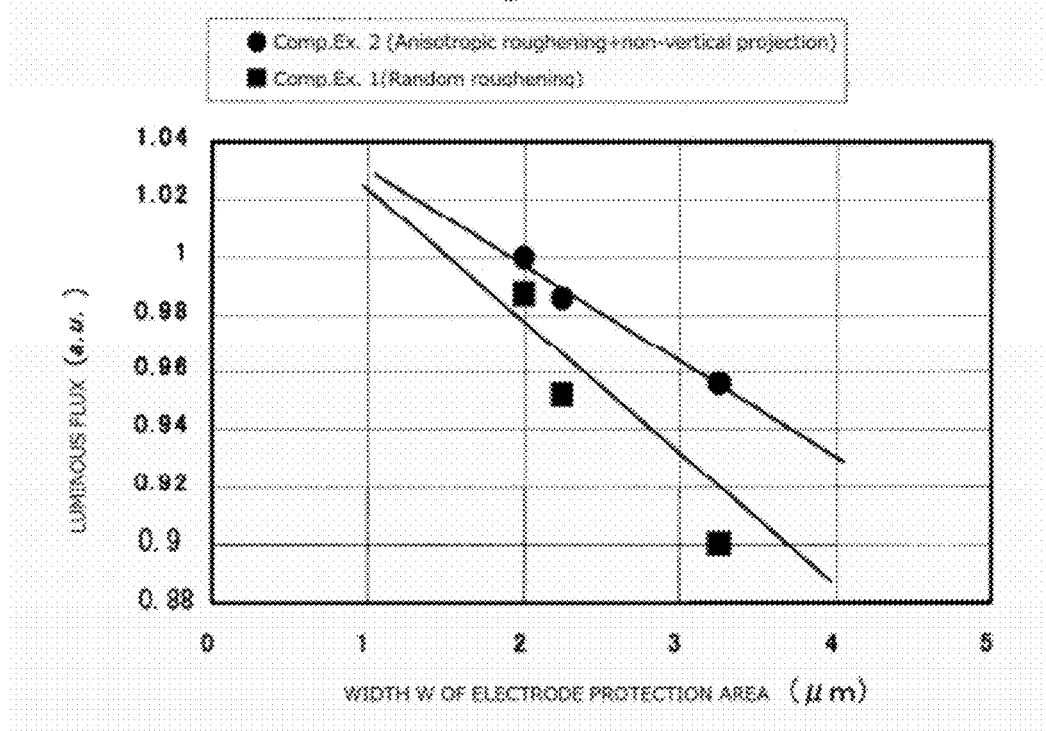
FIG. 14 is a graph showing the relationship between the electrostatic withstanding voltage and the width of the electrode protection area of the semiconductor light-emitting elements in Comparative Examples 1 and 2.

FIG. 14 shows the relationship between the luminous flux of the semiconductor light-emitting elements and the width W of the electrode protection area of the elements in the comparative examples 1 (the roughening of the light extraction surface was randomly performed) and 2 (the direction of the projection formed by anisotropic etching was not perpendicular but parallel to the main direction of the current path). The narrower the width W of the electrode protection area, the brighter the element emits light due to the increase in the roughened area (area covered with the projections). However, both in the cases where the axes of the projection are randomly directed and where they are parallel to the main direction of the current path, the improvement in both the luminance and the electrostatic withstanding voltage cannot meet at the same time.

Figure 15:
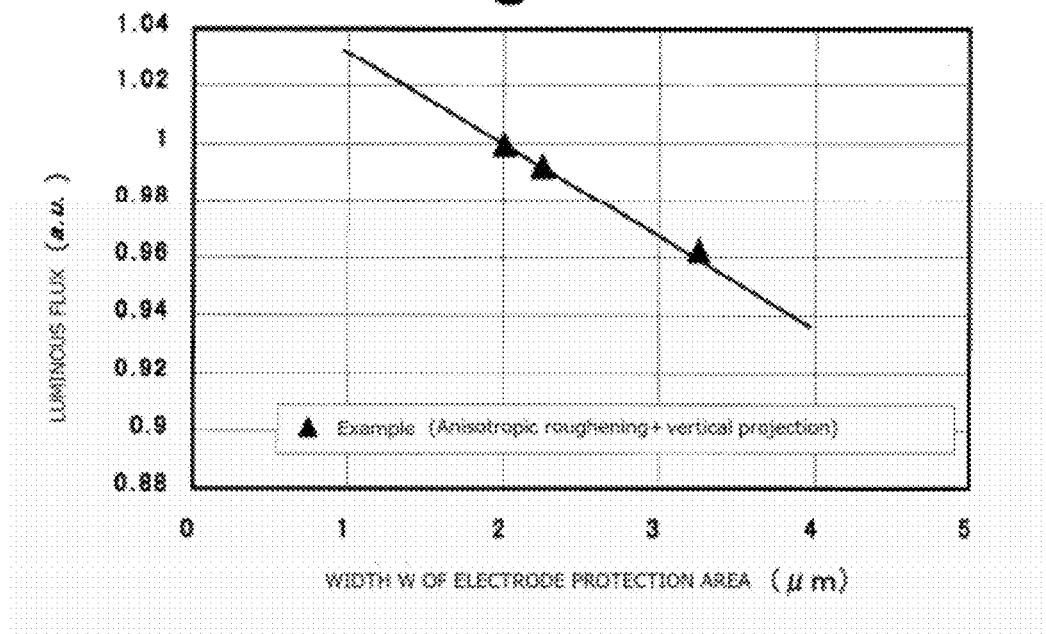
FIG. 15 is a graph showing the relationship between the electrostatic withstanding voltage and the width of the electrode protection area of the Example semiconductor light-emitting element made in accordance with principles of the presently disclosed subject matter.

FIG. 15 shows the relationship between the luminous flux of the semiconductor light-emitting element and the width W of the electrode protection area of the element of the present example wherein the roughening of the light extraction surface was carried out by using anisotropic etching to direct the direction of the axes of the projections perpendicular to the main direction of the current path. Also in this case, the narrower the width W of the electrode protection area (the distance between the roughened area and the electrode), the brighter the element emits light due to the increase in the roughened area (area covered with the projections). Further, the relationship with the electrostatic withstanding voltage is not a trade-off relation as in the comparative examples 1 and 2, but the brightness can be improved while the electrostatic withstanding voltage can be maintained, meaning that the improvement in both the luminance and the electrostatic withstanding voltage can be achieved at the same time.

As described above, the semiconductor light-emitting element of the present example made in accordance with the principles of the presently disclosed subject matter can prevent the electrostatic withstanding voltage from lowering while can improve the optical output.

[Modification 1]

Figure 16A:
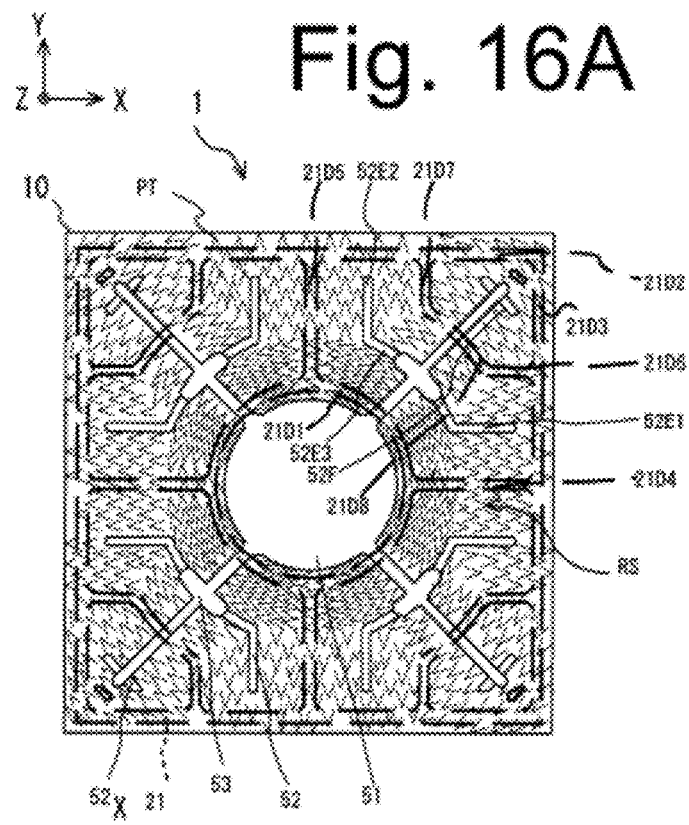
FIG. 16A is a schematic plan view of the semiconductor light-emitting element in Modification 1 of the Example made in accordance with principles of the presently disclosed subject matter.

FIG. 16A is a schematic plan view of the semiconductor light-emitting element 1 in Modification 1 of the present example made in accordance with the principles of the presently disclosed subject matter. Modification 1 is the same as the semiconductor light-emitting element 1 except for the layout of respective electrodes on the light extraction surface and the opposite surface. As in the above-described semiconductor light-emitting element 1, Modification 1 can include the circular Schottky electrode 51, the ohmic electrode 52 (including the surface electrode piece 52E (including a first surface electrode piece portion 52E1 to a third surface electrode piece portion 52E3), and the surface electrode piece 52F), and the connection wiring 53 that are formed on the light extraction surface of a square shape, and the contact electrode 21 (including the first to eighth reflection surface electrode pieces 21D1 to 21D8). The Schottky electrode 51 can be disposed at the center of the light extraction surface. The Schottky electrode 51 can be connected to four linear connection wirings 53 extending to the respective corner portions of the semiconductor light-emitting element 1. The linear ohmic electrode 52 can be provided so as to cross the respective four connection wirings 53. The surface electrode including the Schottky electrode 51 and the ohmic electrode 52 can be patterned such that the shape can be rotational symmetric (four-times rotation) around the center of the semiconductor light-emitting device 1 (overlapped by 90-degree rotation). Accordingly, a description will be given of the electrode structure by dividing the four sections vertically and horizontally symmetric with each other.

Figure 16B:
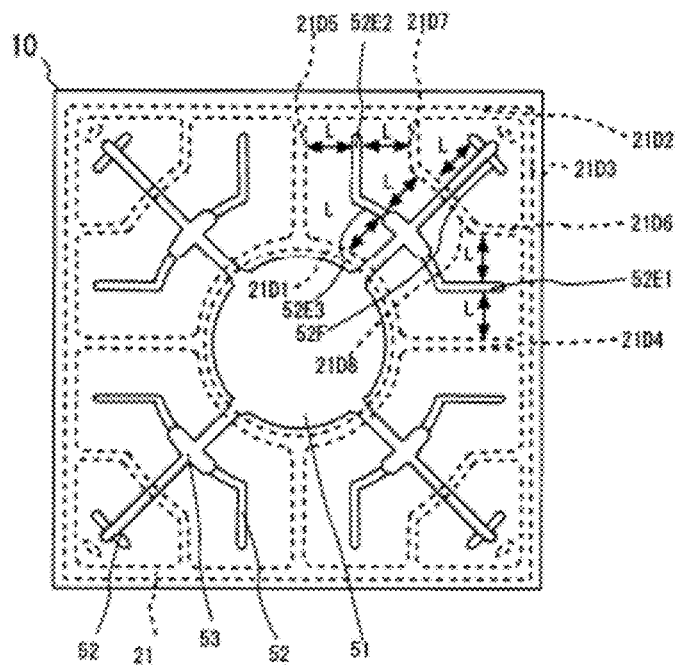
FIG. 16B is a schematic plan view of the semiconductor light-emitting element in which the roughened surface is omitted in Modification 1.

FIG. 16B is a schematic plan view of the semiconductor light-emitting element in which the roughened surface including the projections is omitted in the drawing. A description will be given of the right upper portion thereof. The fourth reflection surface electrode piece 21D4 and the sixth reflection surface electrode piece 21D6 can be arranged parallel to the first surface electrode piece portion 52E1. Then, the first surface electrode piece portion 52E1 can be arranged such that the interelectrode distance L between the first surface electrode piece portion 52E1 and the fourth reflection surface electrode piece 21D4 is equal to that between the first surface electrode piece portion 52E1 and the sixth reflection surface electrode piece 21D6. The fifth reflection surface electrode piece 21D5 and the seventh reflection surface electrode piece 21D7 can be arranged parallel to the second surface electrode piece portion 52E2. Then, the second surface electrode piece portion 52E2 can be arranged such that the interelectrode distance L between the second surface electrode piece portion 52E2 and the fifth reflection surface electrode piece 21D5 is equal to that between the second surface electrode piece portion 52E2 and the seventh reflection surface electrode piece 21D7. The first reflection surface electrode piece 21D1 and the eighth reflection surface electrode piece 21D8 can be arranged parallel to the third surface electrode piece portion 52E3 and the surface electrode piece 52F as concentric arcs. Then, the third surface electrode piece portion 52E3 can be arranged such that the interelectrode distance L between the third surface electrode piece portion 52E3 and the eighth reflection surface electrode piece 21D8 is equal to that between the third surface electrode piece portion 52E3 and the eighth reflection surface electrode piece 21D8 and that between the eighth reflection surface electrode piece 21D8 and the surface electrode piece 52F. In Modification 1, the surface electrode including the Schottky electrode 51 and the ohmic electrode 52 and the contact electrode 21 can be patterned such that the shape can be rotational symmetric (four-times rotation) around the center of the semiconductor light-emitting device 1 (overlapped by 90-degree rotation). Accordingly, the above-described structure can be applied to the other portions including the right lower, left upper, and left lower portions. By arranging the respective electrodes, the main current path direction can be defined in the respective areas by the light extraction side electrode pieces and the reflections surface electrode pieces parallel to each other when viewed from above.

As shown in FIG. 16A, the plurality of conical projections PT in the roughened surface RS can be directed parallel to the extension direction of the reflection surface electrode pieces 21D1 to 21D8 and the surface electrode pieces 52E and 52F2. Such projections can be produced by patterning and dry etching without anisotropic etching, and accordingly, the conical projections PT can be oriented along the arc shape conforming to the shape of the concentric arc or partially parallel to each other.

In Modification 1, the semiconductor light-emitting device 1 can include the portions disposed so that the reflection surface side electrode pieces and the surface electrode pieces are parallel to each other (the portions including the first surface electrode piece portion 52E1, the second reflection surface electrode piece 21D2, the fourth reflection surface electrode piece 21D4 and the sixth reflection surface electrode piece 21D6, and the second surface electrode piece portion 52E2, the third reflection surface electrode piece 21D3, the fifth reflection surface electrode piece 21D5 and the seventh reflection surface electrode piece 21D7). Furthermore, the element 1 can include the portions arranged in concentric arc shape (the first reflection surface electrode piece 21D1, the third surface electrode piece portion 52E3, the eighth reflection surface electrode piece 21D8, and the surface electrode piece 52F). Accordingly, the current path can be controlled, thereby suppressing the increase in area of the electrode on the light extraction surface side and the thickness of the stacked body while preventing local concentration of current. Therefore, the uniform light emission distribution can be obtained.

In Modification 1, the surface electrode including the light extraction surface side electrode and the opposite surface side electrode can be patterned such that the shape can be rotational symmetric (four-times rotation) around the center of the semiconductor light-emitting device 1 (overlapped by 90-degree rotation). Accordingly, when a lens or the like optical member is combined with this semiconductor light-emitting element 1 to form an illumination device, the isotropic light distribution can be provided.

[Modification 2]

Figure 17A:
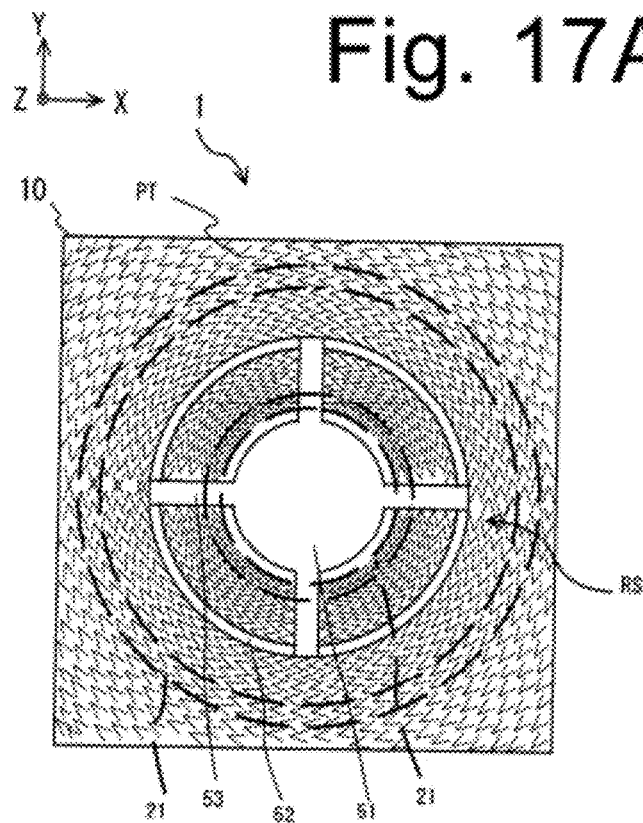
FIG. 17A is a schematic plan view of the semiconductor light-emitting element in Modification 2 of the Example made in accordance with principles of the presently disclosed subject matter.
Figure 17B:
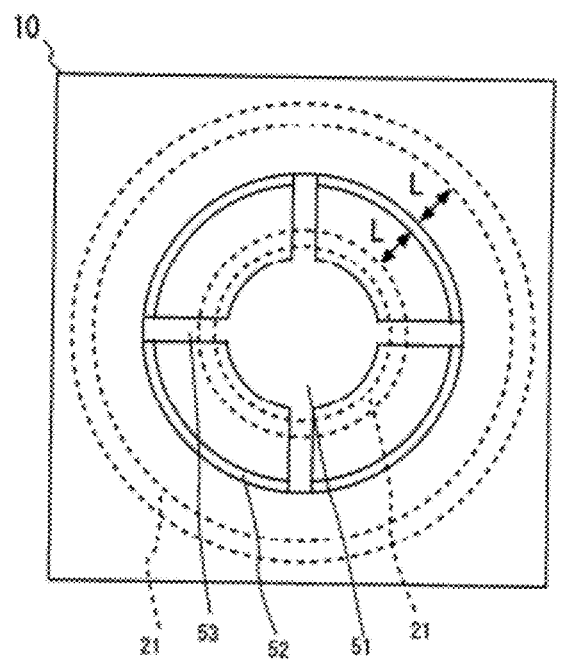
FIG. 17B is a schematic plan view of the semiconductor light-emitting element in which the roughened surface is omitted in Modification 2.

FIG. 17A is a schematic plan view of the semiconductor light-emitting element in Modification 2 when the electrode pattern in the element 1 is changed. In Modification 2, the portions formed by arranging the reflection surface side electrode pieces and the surface electrode pieces parallel to each other in Modification 1 have been omitted, and the reflection surface side electrode pieces and the surface electrode pieces can be arranged to be concentric arc shapes. In Modification 2, on the square light extraction surface side, a circular Schottky electrode 51 and concentric circular ohmic electrodes 52 connected to the Schottky electrode 51 via cross-shaped connection wirings 53 are formed. On the reflection surface side, two circular contact electrodes 21 (see FIG. 17B) can be formed so as to be separated from the ohmic electrodes 52 with equidistance (interelectrode distance L).

The circular electrode can be a counter electrode and the current path can be controlled by the direction of the dry etched projections. Accordingly, Modification 2 can improve the optical output and the electrostatic withstanding voltage while preventing the local concentration of electric field and suppressing the increase in the electrode area on the light extraction surface side and the thickness of the stacked body.

In the above-described semiconductor light-emitting elements in the exemplary embodiment, example, and modifications, the conductivity types of the respective layer can be appropriately changed from the n-type to the p-type and vice versa. Further, the compositions (carrier concentration and the like) and the layer thicknesses of the respective layers can be appropriately changed as long as the advantageous effects of the presently disclosed subject matter can be provided.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light-emitting element comprising:
   a support substrate;
   a semiconductor light-emitting stacked body including a first semiconductor layer formed on the support substrate, an active layer formed on the first semiconductor layer, and a second semiconductor layer formed on the active layer;
   a first electrode including at least one linear first electrode piece that is disposed on a surface of the first semiconductor layer close to the support substrate and in ohmic contact with the first semiconductor layer;
   a second electrode including at least one linear second electrode piece that is disposed on a surface of the second semiconductor layer and in ohmic contact with the second semiconductor layer; and
   a plurality of conical projections formed on the second semiconductor layer, wherein
   the first electrode piece and the second electrode piece are disposed so as not to overlap with each other in a stacked direction of the semiconductor light-emitting stacked body but to be parallel with each other when viewed from above, and
   the plurality of conical projections disposed between the first and second electrode pieces are disposed in parallel with each other with extension axes that form an angle of ±26 degrees with respect to an extension direction of the first and second electrode pieces.

2. The semiconductor light-emitting element according to claim 1, wherein an angle formed between the axis of the plurality of conical projections and the surface of the support substrate is 30 degrees or larger and 70 degrees or smaller.

3. The semiconductor light-emitting element according to claim 1, wherein the first electrode piece and the second electrode piece each include a plurality of electrode pieces in parallel to two opposed sides of the support substrate, and
   respective axes of the plurality of conical projections form an angle of ±26 degrees with the extension direction of the first electrode piece and the second electrode piece.

4. The semiconductor light-emitting element according to claim 2, wherein the first electrode piece and the second electrode piece each include a plurality of electrode pieces in parallel to two opposed sides of the support substrate, and
   respective axes of the plurality of conical projections form an angle of ±26 degrees with the extension direction of the first electrode piece and the second electrode piece.

5. A method for producing a semiconductor light-emitting element, comprising:
- forming a semiconductor light-emitting stacked body including a first semiconductor layer formed on a growth substrate, an active layer formed on the first semiconductor layer, and a second semiconductor layer formed on the active layer;
- forming a second electrode including at least one linear second electrode piece on a surface of the second semiconductor layer so as to be in ohmic contact with the second semiconductor layer;
- joining the semiconductor light-emitting stacked body having the second electrode formed therein with a support substrate;
- removing the growth substrate from the semiconductor light-emitting stacked body;
- forming a first electrode including at least one linear first electrode piece on a surface of the first semiconductor layer so as to be in ohmic contact with the first semiconductor layer; and
- forming a plurality of conical projections on an area of the first semiconductor layer where the first electrode is not formed, wherein
- during forming the first electrode, the first electrode piece and the second electrode piece are disposed so as not to overlap with each other in a stacked direction of the semiconductor light-emitting stacked body and to be parallel with each other when viewed from above,
- during forming the plurality of conical projections, the plurality of conical projections disposed between the first and second electrode pieces disposed in parallel with each other have extension axes that form an angle of ±26 degrees with respect to the extension direction of the first and second electrode pieces.

6. The method for producing a semiconductor light-emitting element according to claim 5, wherein forming the plurality of conical projections is performed by forming the projections on the first semiconductor layer by anisotropic etching.

7. The method for producing a semiconductor light-emitting element according to claim 6, wherein
- the growth substrate is a GaAs substrate inclined with an angle of 10 degrees or larger and 25 degrees or smaller from a {100} plane;
- the semiconductor light-emitting stacked body, the first semiconductor layer, and the second semiconductor layer are formed from an AlGaInP-based material;
- the forming of a plurality of conical projections is performed using an etching solution including HBr, HCl, HF, and halide compounds on an exposed surface of the second semiconductor layer after removing the growth substrate according to a difference in etching range between a plane direction of {111} A plane and a plane direction of {111} B plane.

* * * * *